(12) United States Patent
Hiramatsu et al.

(10) Patent No.: US 7,498,736 B2
(45) Date of Patent: Mar. 3, 2009

(54) LUMINESCENT MATERIAL

(75) Inventors: Ryosuke Hiramatsu, Kawasaki (JP); Masaaki Tamatani, Fujisawa (JP); Hironori Asai, Yokohama (JP); Kazuaki Ootsuka, Yokosuka (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/626,229

(22) Filed: Jan. 23, 2007

(65) Prior Publication Data
US 2008/0018234 A1    Jan. 24, 2008

(30) Foreign Application Priority Data
Jul. 19, 2006    (JP) .............................. 2006-197293

(51) Int. Cl.
*H01J 1/62*    (2006.01)
*H01J 63/04*    (2006.01)

(52) U.S. Cl. ....................... 313/503; 313/504; 313/505; 313/506

(58) Field of Classification Search ........... 252/301.4 F, 252/301.6 F, 301.4 R, 301.4 P, 301.6 S, 301.6 R, 252/301.6 P, 301.4 S; 313/498–512
See application file for complete search history.

(56) References Cited
FOREIGN PATENT DOCUMENTS
JP    2005-232305    *    9/2005
JP    2005-277441    *    10/2005

* cited by examiner

*Primary Examiner*—Joseph L. Williams
*Assistant Examiner*—Elmito Breval
(74) *Attorney, Agent, or Firm*—Amin, Turocy & Calvin, LLP

(57) ABSTRACT

A luminescent material is provided, which includes a material formed of a single composition containing the main crystal phase and an activator which causes light emission. The material exhibits a narrowband light emission spectrum in a wavelength ranging from 540 nm to 550 nm and a broadband light emission spectrum in a wavelength ranging from 500 nm to 600 nm when the material is excited with light having the main light emission peak having a wavelength ranging from 370 nm to 460 nm.

9 Claims, 13 Drawing Sheets

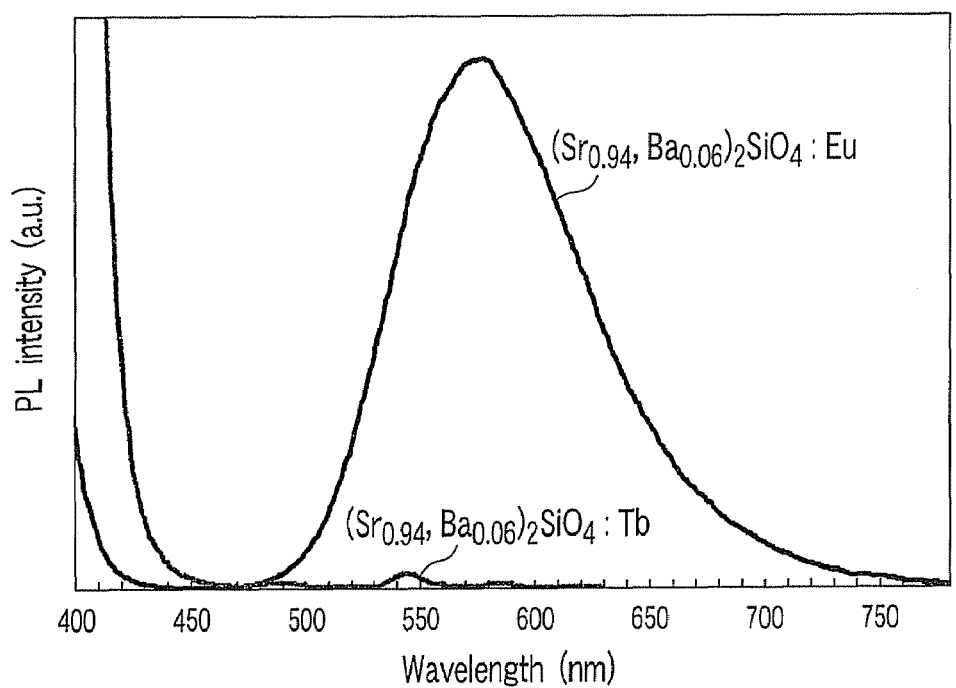
F I G. 1
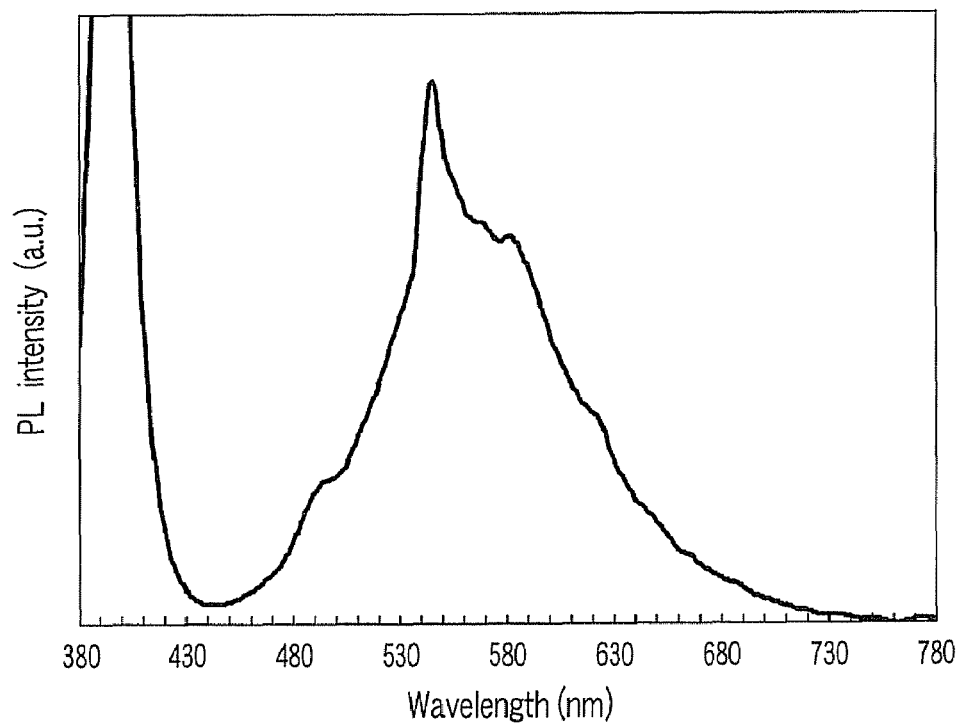
F I G. 2

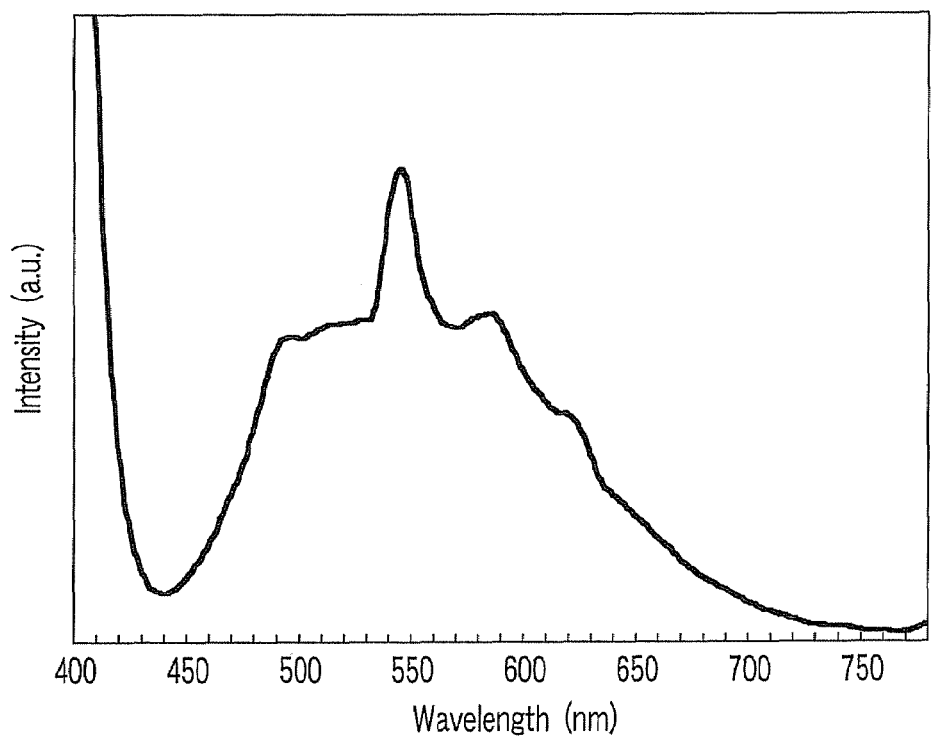
F I G. 5
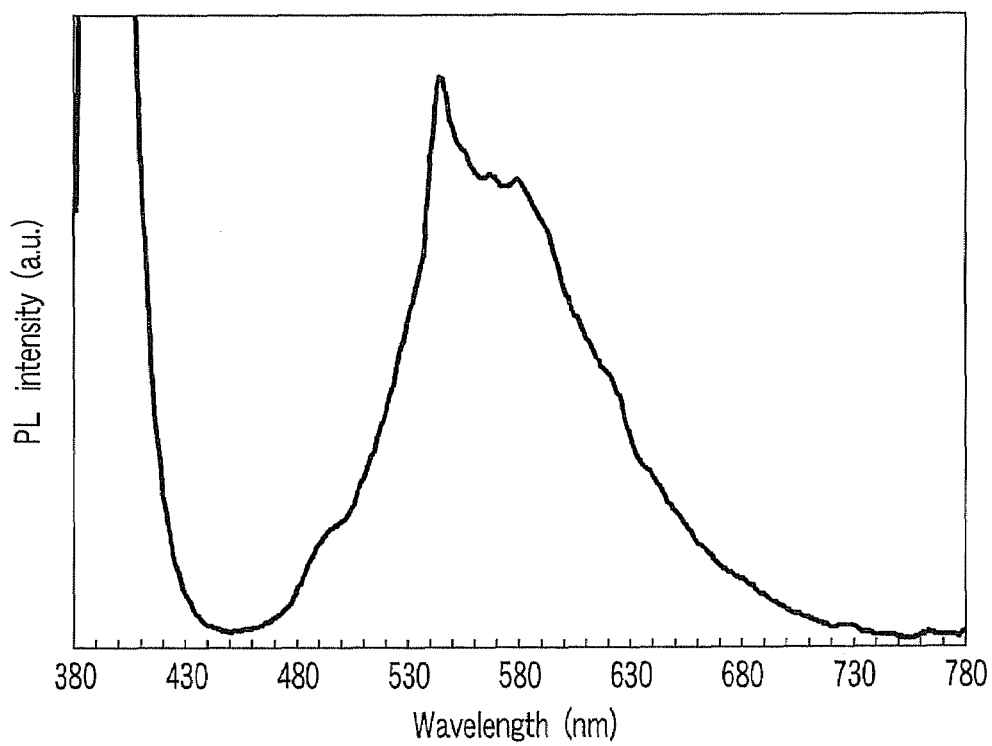
F I G. 6

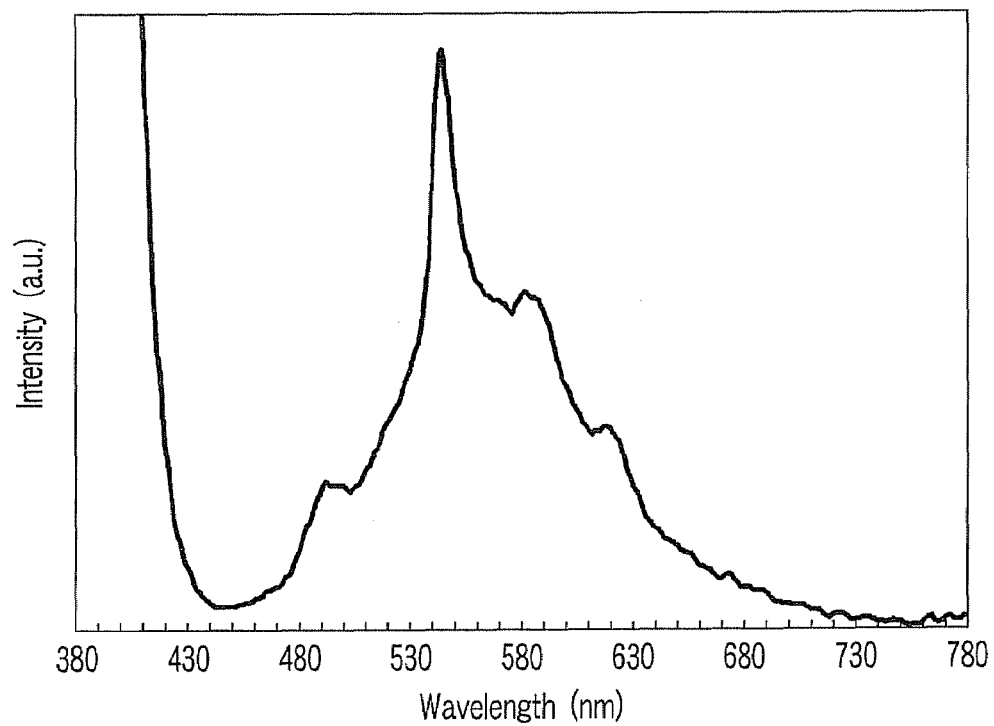
F I G. 7
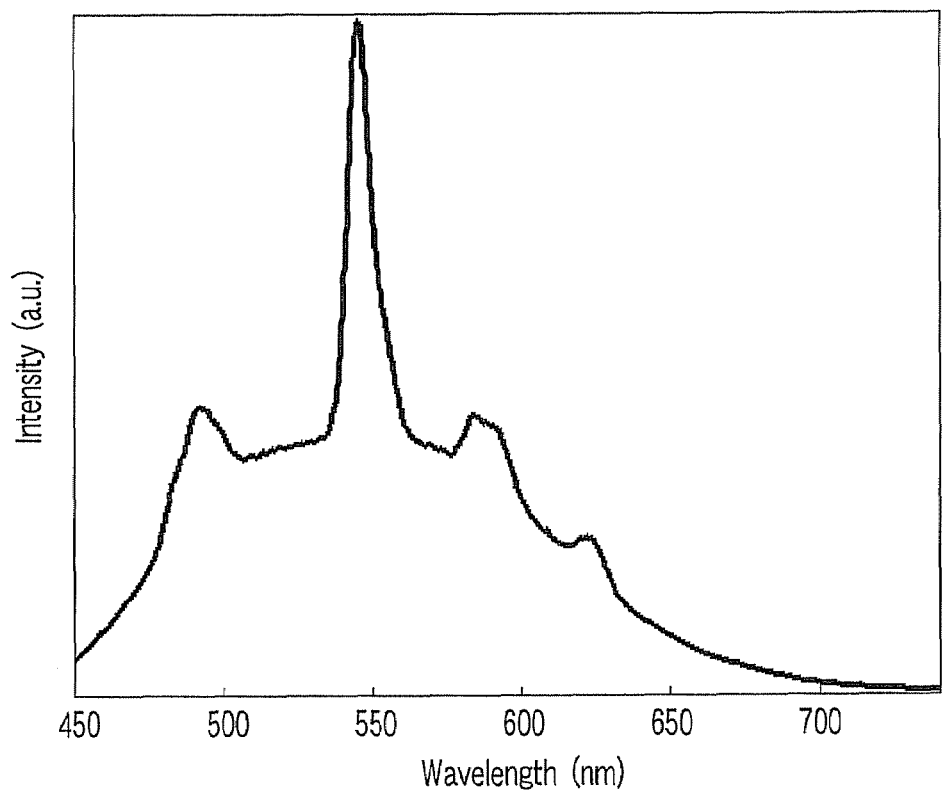
F I G. 8

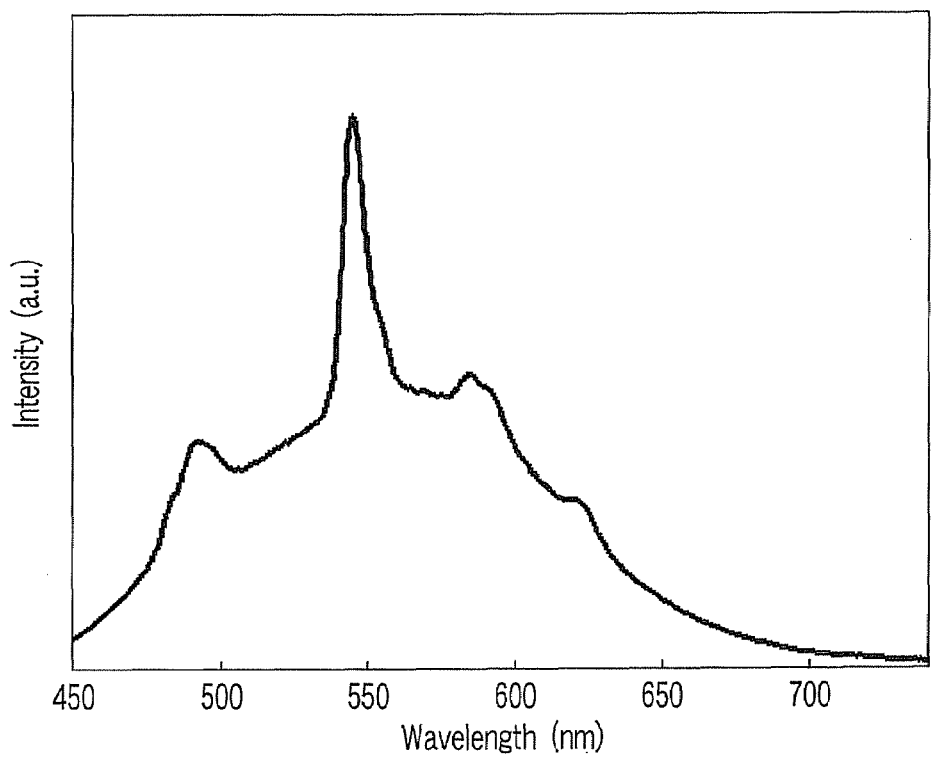
F I G. 9
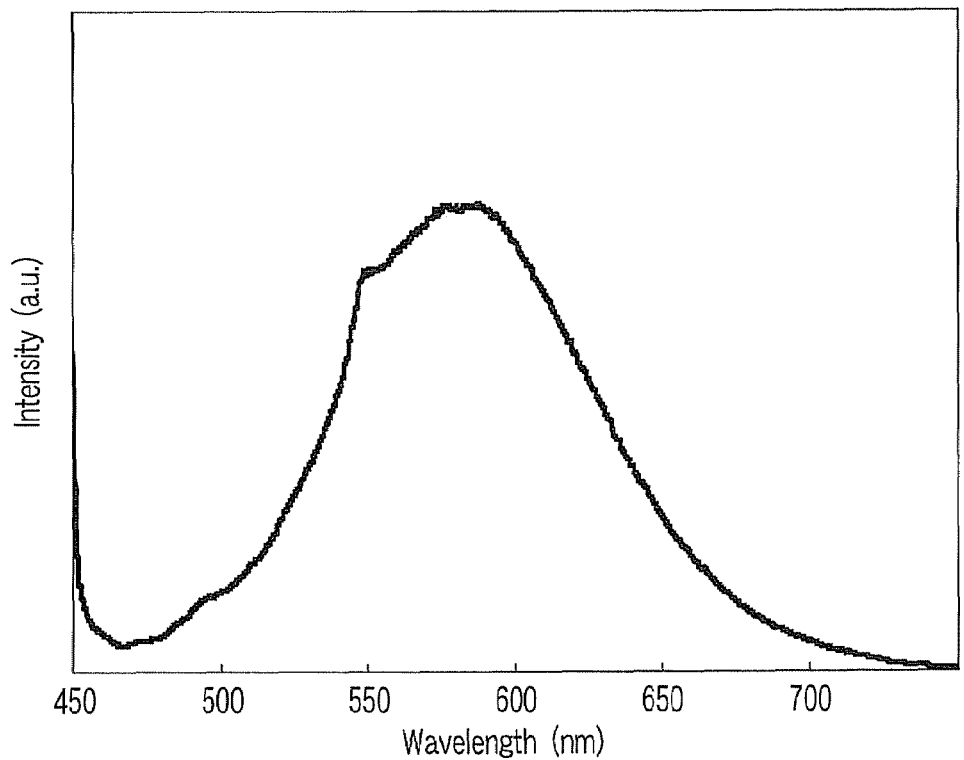
F I G. 10

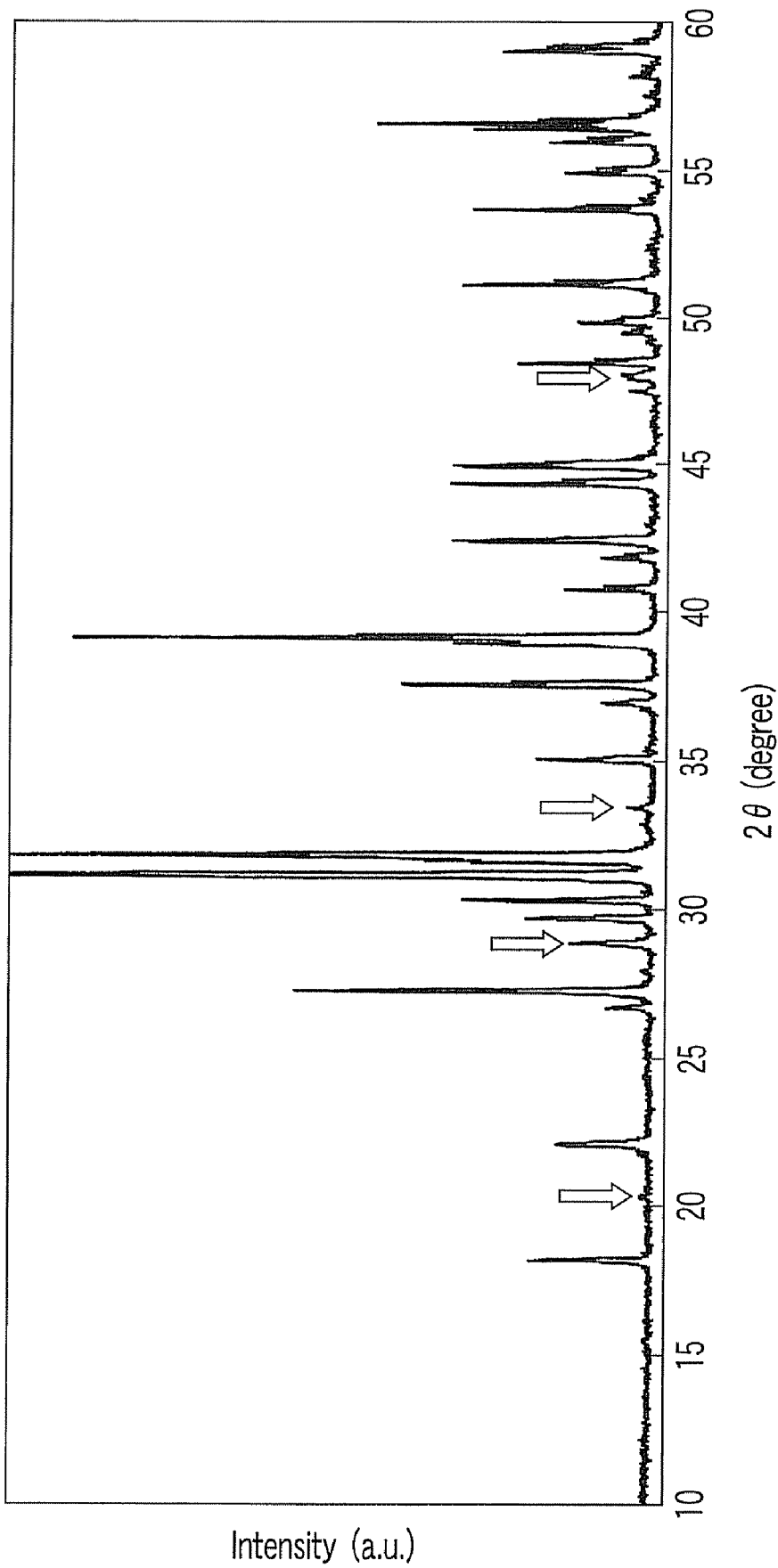
F I G. 13

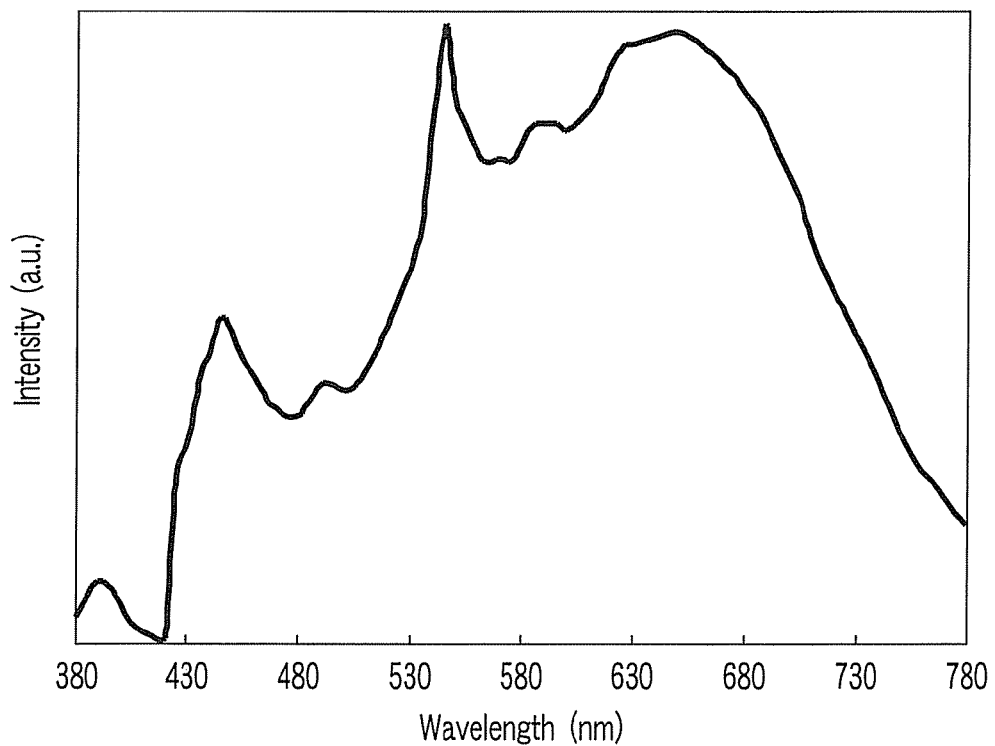
F I G. 20
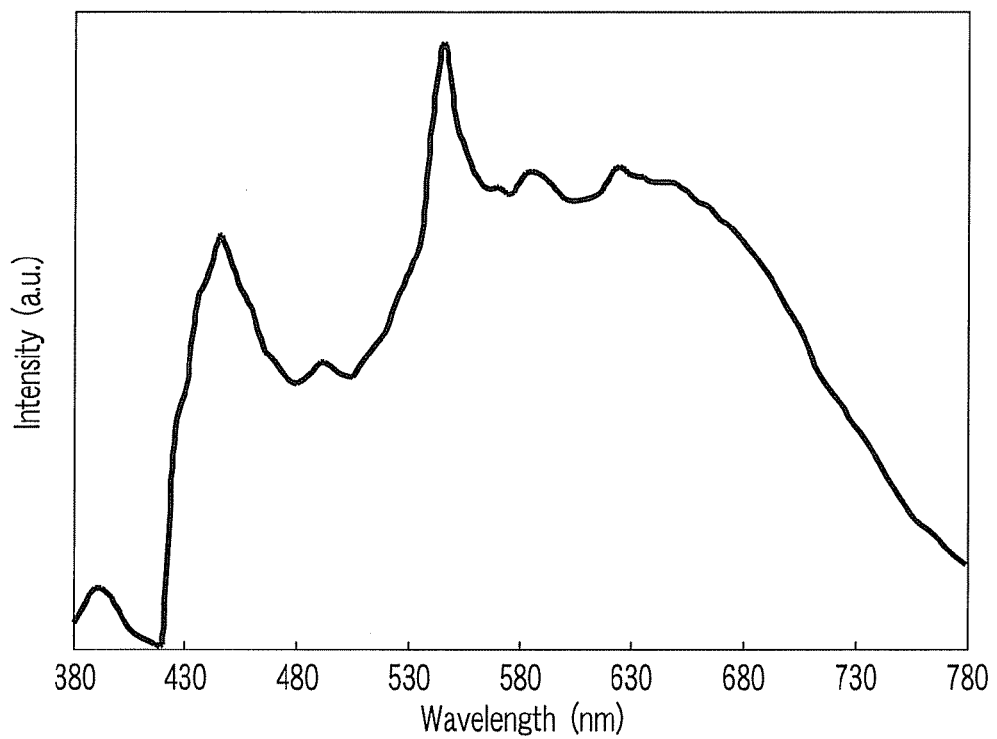
F I G. 21

LUMINESCENT MATERIAL

CROSS-REFERENCE TO RELATED APPLICATIONS

This application is based upon and claims the benefit of priority from prior Japanese Patent Application No. 2006-197293, filed Jul. 19, 2006, the entire contents of which are incorporated herein by reference.

BACKGROUND OF THE INVENTION

1. Field of the Invention

This invention is related to a luminescent material, a manufacturing method of the luminescent material, and light-emitting device.

2. Description of the Related Art

A light-emitting diode (LED) is constituted of a combination of an LED chip as a light source for excitation and a luminescent material, and various colors can be emitted by that combination. In a white LED emitting white light, a combination of LED chips emitting light having a wavelength ranging from 360 nm to 500 nm and luminescent materials is used. For instance, a combination of the LED chips emitting light of mainly blue region and yellow luminescent material which emits luminescence of yellow color can be mentioned. Furthermore, a combination of the LED chips emitting light of ultraviolet or near-ultraviolet ray region and luminescent material mixture can be mentioned. In the luminescent material mixture, a blue luminescent material which emits luminescence of blue color, a green-yellow luminescent material which emits luminescence of green-yellow color, and red luminescent material which emits luminescence of red color are contained. As for the luminescent material used for the white LED, it is demanded that the luminescent material absorbs light in the region from the near-ultraviolet region to the blue region of light-emitting wavelength of 360 to 500 nm well, and that efficiently emits visible light.

White LEDs using alkaline earth ortho-silicate luminescent material activated by bivalent europium are proposed. Such a luminescent material has a composition represented by $(Sr,Ba,Ca)_2SiO_4$:Eu and capable of emit a light having arbitrary peak wavelength by varying mixing ratio of alkaline earth metal element. However, these white LEDs are used by combination with luminescent material having broadband emission spectrum of half-width 80 nm or more. For that reason, there is a limit in color rendering property.

Furthermore, the white LEDs in which luminescent material activated by Tb and light-emitting element have been proposed. The light-emitting element used here is that which has the light emission peak at 365 nm. The 365 nm ultraviolet LED has too much short wavelength for illumination use, and degradation of resin coating the luminescent material is large. Furthermore, manufacturing cost of the 365 nm ultraviolet LED is higher than that of the LED chip which emits light in 370-460 nm region, and conversion efficiency from electricity to light is low.

BRIEF SUMMARY OF THE INVENTION

A luminescent material according to one aspect of the present invention comprises a material formed of a single composition containing the main crystal phase and an activator which causes light emission, the material exhibiting a narrowband light emission spectrum in a wavelength ranging from 540 nm to 550 nm and a broadband light emission spectrum in a wavelength ranging from 500 nm to 600 nm when the material being excited with light having the main light emission peak having a wavelength ranging from 370 nm to 460 nm.

A luminescent material according to another aspect of the present invention comprises a material containing an alkaline earth ortho-silicate compound and an activator which causes a light emission, the material exhibiting a narrowband light emission spectrum in a wavelength ranging from 540 nm to 550 nm and a broadband light emission spectrum in a wavelength ranging 500 nm to 600 nm when the material being excited with light having the main light emission peak having a wavelength ranging from 370 nm to 460 nm.

A luminescent material according to another aspect of the present invention comprises a compound having composition represented by following general formula (A).

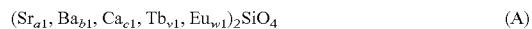

$$(Sr_{a1}, Ba_{b1}, Ca_{c1}, Tb_{v1}, Eu_{w1})_2SiO_4 \quad (A)$$

wherein, a1, b1, c1, v1, and w1 satisfy following relationships:

$$a1+b1+c1+v1+w1=1 \quad (1);$$

$$0 \leq a1/(1-v1-w1) \leq 1 \quad (2);$$

$$0 \leq b1/(1-v1-w1) \leq 1 \quad (3);$$

$$0 \leq c1/(1-v1-w1) \leq 1 \quad (4);$$

$$0 < v1 \leq 0.15 \quad (5);$$

$$0 < w1 \leq 0.05 \quad (6).$$

A luminescent material according to another aspect the present invention comprises a compound having a composition represented by the following general formula (B)

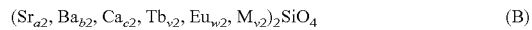

$$(Sr_{a2}, Ba_{b2}, Ca_{c2}, Tb_{v2}, Eu_{w2}, M_{v2})_2SiO_4 \quad (B)$$

wherein M is at least one selected from the group consisting of Li, Na, K, Rb, and Cs, and a2, b2, c2, v2, and w2 satisfy following relationships.

$$a2+b2+c2+2v2+w2=1 \quad (7);$$

$$0 \leq a2/(1-2v2-w2) \leq 1 \quad (8);$$

$$0 \leq b2/(1-2v2-w2) \leq 1 \quad (9);$$

$$0 \leq c2/(1-2v2-w2) \leq 1 \quad (10);$$

$$0 < v2 \leq 0.15 \quad (11);$$

$$0 < w2 \leq 0.05 \quad (12).$$

A method for manufacturing a luminescent material according to another aspect of the present invention comprises heating a raw material in a reducing atmosphere constituted by $N_2/H_2$ or $Ar/H_2$ to obtain a primary sintered product; pulverizing the primary sintered product to obtain a pulverized primary sintered product; housing the pulverized primary sintered product into a container; arranging the container housing the pulverized primary sintered product to a furnace; substituting an atmosphere in the furnace with an inert gas; and heating the pulverized primary sintered product in the reducing atmosphere constituted by $N_2/H_2$ or $Ar/H_2$ containing hydrogen at a concentration of 5% or more and less than 100% to obtain a secondary sintered product.

A light-emitting device according to another aspect of the present invention comprises a light-emitting element emitting light, the light having a main light emission peak in a wavelength ranging from 370 nm to 460 nm; and a luminescent layer comprising a luminescent material configured to be irradiated with the light, at least a part of the luminescent material being the above-mentioned luminescent material.

BRIEF DESCRIPTION OF THE SEVERAL VIEWS OF THE DRAWING

FIG. 1 is a light-emitting spectrum of a conventional luminescent material.

FIG. 2 is a light-emitting spectrum of a luminescent material according to one embodiment.

FIG. 5 is a light-emitting spectrum of a luminescent material according to another embodiment.

FIG. 6 is a light-emitting spectrum of a luminescent material according to another embodiment.

FIG. 7 is a light-emitting spectrum of a luminescent material according to another embodiment.

FIG. 8 is a light-emitting spectrum of a luminescent material according to another embodiment.

FIG. 9 is a light-emitting spectrum of a luminescent material according to another embodiment.

FIG. 10 is a light-emitting spectrum of a luminescent material according to another embodiment.

FIG. 13 is an X-ray diffraction pattern of a luminescent material according to another embodiment.

FIG. 20 is a light-emitting spectrum of a white LED according to one embodiment.

FIG. 21 is a light-emitting spectrum of a white LED according to another embodiment.

DETAILED DESCRIPTION OF THE INVENTION

Figure 3:
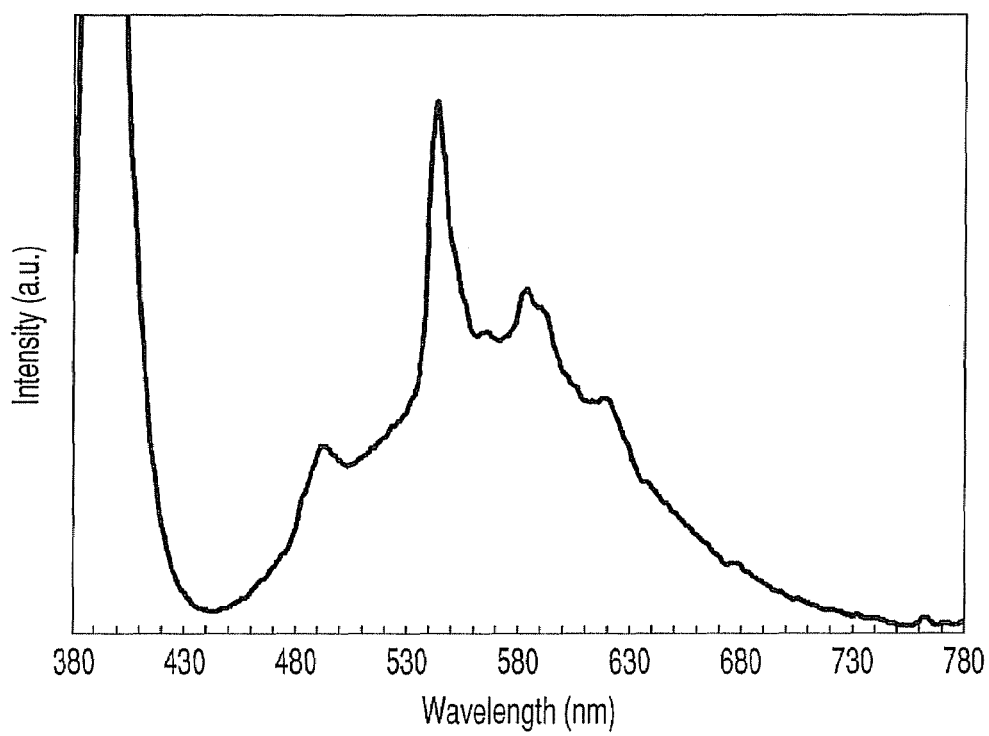
FIG. 3 is a light-emitting spectrum of a luminescent material according to another embodiment.

Embodiments of the present invention are flowingly explained. The following embodiments are to exemplify the luminescent material and the light-emitting device to embody a technical thought of this invention and this invention is not limited to the followings.

Furthermore, the specifications do not specify members shown in a scope of claims as the members listed in the form of the embodiment. In particular, unless there is especially specific description for dimension, quality of material and shape of a constituting parts and their relative arrangement or the like described in the embodiment are not to the effect of limiting the range of the invention to them but nothing but an explanatory example. In addition, size and positional relationship or the like of the members shown in the figures may be exaggerated in order to clarify the explanation. Incidentally, in the following explanation, the same name and sign show the same member or the member of the same quality, and the detailed explanation is abbreviated accordingly. Furthermore, respective factors constituting this invention may be an aspect that one member covers a plurality of factors by constituting a plurality of the factors by the same member, and on the contrary, be realized by sharing a function of one member with a plurality of the members.

As a result of repeated deliberations and researches, the inventors found the luminescent material in which a narrowband light-emitting spectrum and a broadband light-emitting spectrum are shown respectively in specified wavelength regions when excited by light having the main light-emitting in the wavelength ranging from 370 nm to 460 nm. In addition, because a manufacturing cost of the 365 nm ultraviolet light-emitting LED is higher than that of the LED chip to emit light in the wavelength ranging from 370 nm to 460 nm, and conversion efficiency from electricity to light is low, the lower limit of the excitation wavelength on practical side is regulated to 370 nm. Furthermore, because only the broadband light-emitting spectrum is shown when excited by the wavelength exceeding 460 nm and the narrowband light-emitting spectrum characteristic in the embodiment of this invention cannot be obtained, the upper limit of the excitation wavelength is regulated to 460 nm.

The narrowband light-emitting spectrum appears in the wavelength ranging from 540 nm to 550 nm, while the broadband light-emitting spectrum appears in the wavelength ranging from 500 nm to 600 nm. These upper and lower limits of the wavelength region of the light-emitting spectrum are determined by the following reason. The narrowband light-emitting spectrum is a light-emitting band due to $^5D_4 \rightarrow {}^7F_5$ transition of terbium and the light-emitting band is light emission by 4f-4f transition shielded from outside, because it is not much influenced by peripheral surroundings such as a constituting element and a crystal structure and takes an ion-specific value, a peak of the narrowband light-emitting spectrum appears in the wavelength ranging from 540 nm to 550 nm. Furthermore, based on that the broadband light-emitting spectrum is the light-emitting band due to light emission by f-d transition of europium and the light-emitting spectrum of europium activated alkaline earth ortho-silicate compound in which terbium is not activated in a range of europium content of $0 < w1 \leqq 0.1$ is within the wavelength ranging from 500 nm to 600 nm, the wavelength region of the light-emitting spectrum is determined. The luminescent material in the embodiments can show the narrowband light-emitting spectrum and the broadband light-emitting spectrum in a specified wavelength region by being excited with a light having a peak wavelength from a near-ultraviolet region to a blue region. Furthermore, the luminescent material has a single composition containing the main crystal phase and an activator. The main crystal phase means that of which the intensity of diffraction peak is the largest in all the identified crystal phases.

The narrowband light-emitting spectrum is the spectrum characterized by the narrowband light emission in which a measured half bandwidth of the light-emitting band is 50 nm or less, and the broadband light-emitting spectrum means the spectrum characterized by the broadband light emission in which a measured half bandwidth of the light-emitting spectrum is 80 nm or more. The light-emitting spectrum can be obtained by exciting the luminescent material by from the blue LED to the near ultraviolet LED or the like, and for instance, by measuring by a spectrophotometer of IMUC-7000G of Otsuka Electronics Co. Ltd. or the like.

The luminescent material in the embodiment is concretely the luminescent material containing a main crystal phase and terbium and europium as the activator, and the narrowband light-emitting spectrum of the light-emitting region ranging from 540 nm to 550 nm is result from terbium. In the case the narrowband light-emitting spectrum and the broadband light-emitting spectrum are overlapped, the half bandwidth can be obtained the following way. Firstly, the light-emitting spectrum (co-activated spectrum) of the luminescent material activated by terbium and europium and the light-emitting spectrum (single activated spectrum) of the luminescent material activated by only europium of the same composition and the same concentration are prepared. By removing the single activated spectrum from co-activated spectrum, the half bandwidth can be obtained from a shape of the remaining light-emitting spectrum.

The luminescent material of the embodiment can contain an alkaline earth ortho-silicate compound as the main crystal phase. As the luminescent material containing the alkaline earth ortho-silicate luminescent material as the main crystal phase, $(Sr, Ba, Ca)_2SiO_4$:Eu which is activated by europium has been known previously. By combining the luminescent material of the embodiment of this invention with the light-emitting element to emit a light having the light emission peak in the wavelength ranging from 370 nm to 460 nm, the LED light-emitting device of the embodiment can be obtained. As for the LED light-emitting device according to embodiments, efficiency and color rendering properties are more improved than those of the LED light-emitting device using a conventional luminescent material, and such findings have been discovered by the inventors.

The luminescent material of the embodiment having the above described spectrum characteristics has for instance the composition represented by the following general formula (A). That is, this is alkaline earth ortho-silicate luminescent material activated by terbium and europium.

$$(Sr_{a1}, Ba_{b1}, Ca_{c1}, Tb_{v1}, Eu_{w1})_2SiO_4 \quad (A)$$

In the above general formula (A), a1, b1, c1, v1 and w1 are values to satisfy relations represented by the following mathematical formulae.

$$a1+b1+c1+v1+w1=1 \quad (1);$$

$$0 \leq a1/(1-v1-w1)c1 \leq 1 \quad (2);$$

$$0 \leq b1/(1-v1-w1) \leq 1 \quad (3);$$

$$0 \leq c1/(1-v1-w1) \leq 1 \quad (4);$$

$$0 < v1 \leq 0.15 \quad (5);$$

$$0 < w1 \leq 0.05 \quad (6).$$

In the alkaline earth ortho-silicate compound, Sr, Ca, and Ba exist in a state of complete solid solution. By this condition and the mathematical formulae (1), (5), and (6), the range of values a1, b1 and c1 related to the alkaline earth metal content is decided. That is, the mathematical formulae (2), (3) and (4) are guided by these conditions.

Furthermore, either value of a1/(1−v1−w1), b1/(1−v1−w1), and c1/(1−v1−w1) exceeds 1, the composition ratio of the $(Sr_{a1}, Ba_{b1}, Ca_{c1}, Tb_{v1}, Eu_{w1})_2SiO_4$ luminescent material is deviated from stoichiometrical composition ratio. Caused by this, the light-emitting efficiency is damaged.

Since Ba is a toxic material, and the material regulated by the regulations for the control of the poisonous and deleterious materials and exerts a harmful effect, it is desirable that Ba content can be reduced as much as possible.

Furthermore, when experiments are repeated and sample evaluations are carried out, in the case the value of b1/(1−v1−w1) is 0.2 or less and c1/(1−v1−w1) is 0.9 or less respectively regarding the Ba content b1 and the Ca content c1, the narrowband spectrum part was found to be significantly large. According to the above, in the alkaline earth ortho-silicate compound described by the general formula (A), it is more preferable that the value of b1/(1−v1−w1) is 0.2 or less, and c1/(1−v1−w1) is 0.9 or less.

The luminescent material of the embodiment contains both Tb and Eu. Therefore, v1 and w1 in the above described general formula (A) are both larger than zero. In the case (v1=0) Tb is not contained, it is only the broadband light emission of $Eu^{2+}$ that is obtained when excited by the light having the main light emission peak in 370 to 460 nm. The light emission ranging from 540 nm to 550 nm caused by $Tb^{3+}$ cannot be obtained. In the case (w1=0) Eu is not contained, when excited by the light having the main light emission peak in 370 to 460 nm, light emission of the wavelength ranging from 540 nm to 550 nm caused by $Tb^{3+}$ becomes significantly small. In order to obtain light emission ranging from 540 nm to 550 nm, Tb and Eu are both contained by the luminescent material of the embodiment as the indispensable activator. Furthermore, from the following reasons, there is the upper limit for the content of such an activator.

In the case the Tb content is too much, a concentration quenching phenomenon occurs, and a light intensity of Eu in $(Sr_{a1}, Ba_{b1}, Ca_{c1}, Tb_{v1}, Eu_{w1})_2SiO_4$ luminescent material becomes weaker. That is, hidden behind $Eu^{2+}$ broadband light emission, the light emission of the wavelength region of 540 to 550 nm of $Tb^{3+}$ becomes not to be obtained. In order to avoid such inconvenience, the upper limit of the Tb content (v1) is specified to be 0.15. It is more preferable that v1 is within a range of $0 < v1 \leq 0.1$.

Furthermore, in the case the Eu content is too much, a band light emission of $Eu^{2+}$ becomes too much, and a light intensity of Tb in $(Sr_{a1}, Ba_{b1}, Ca_{c1}, Tb_{v1}, Eu_{w1})_2SiO_4$ luminescent material becomes weaker. That is, hidden behind $Eu^{2+}$ broadband light emission, the light emission of the wavelength region of 540 nm to 550 nm of $Tb^{3+}$ becomes not to be obtained. In order to avoid such inconvenience, the upper limit of the Eu content (w1) is specified to be 0.05. It is more preferable that w1 is within a range of $0 < w1 \leq 0.01$.

Furthermore, in order that the narrowband light emission by terbium which is characteristics of the embodiment of this invention is not obstructed by the broadband light emission of europium, and that the narrowband light emission of terbium is efficiently obtained, it is preferable that the Tb content is more than the Eu content. For instance, if the value of v1/w1 is within a range of approximately 1 to 25, its effect is further exerted. It is more preferable that the value of v1/w1 is within a range of 2 to 20.

In the luminescent material having a composition represented by the above general formula (A), terbium exists by substituting a site constituted by bivalent positive ions such as calcium, strontium, and barium. Terbium becomes a trivalent $Tb^{3+}$ state in light-emitting a green color characteristic to the wavelength region of 540 to 550 nm. For that reason, in order to substitute the bivalent site with the trivalent site easily, in adding terbium, a monovalent positive ion is sometimes added simultaneously as charge compensation. As the monovalent positive ion element, lithium, sodium, potassium, rubidium, cesium, copper, silver, and gold or the like are mentioned. The luminescent material in which the charge has compensated can be represented by the following general formula (B).

$$(Sr_{a2}, Ba_{b2}, Ca_{c2}, Tb_{v2}, Eu_{w2}, M_{y2})_2SiO_4 \quad (B)$$

M is at least one selected from the group consisting of Li, Na, K, Rb, and Cs. Furthermore, a2, b2, c2, v2, and w2 have values satisfying the relation represented by the following mathematical equations.

$$a2+b2+c2+2v2+w2=1 \quad (7);$$

$$0 \leq a2/(1-2v2-w2) \leq 1 \quad (8);$$

$$0 \leq b2/(1-2v2-w2) \leq 1 \quad (9);$$

$$0 \leq c2/(1-2v2-w2) \leq 1 \quad (10);$$

$$0 < v2 \leq 0.15 \quad (11);$$

$$0 < w2 \leq 0.05 \quad (12).$$

In analyzing contents of the each element, the synthesized luminescent material is firstly alkaline fused. Analysis is made to this by for instance an ICP light emission spectroscopy of internal standard by SII Nanotechnology Inc. SPS1200AR or the like. Thus, composition of the luminescent material represented by the above general formula (B) is obtained.

As described above, in the alkaline earth ortho-silicate compound, Sr, Ca, and Ba exist in a state of complete solid solution. By this condition and the terbium and element M content v2 and the europium content w2 which are activators, the range of values a2, b2 and c2 related to the alkaline earth metal content is decided. That is, the mathematical formulae (8), (9), and (10) are derived by such conditions.

When $a2/(1-2v2-w2)$ exceeds 1, it is deviated from the stoichiometrical composition of the $(Sr_{a2}, Ba_{b2}, Ca_{c2}, Tb_{v2}, Eu_{w2}, M_{v2})_2SiO_4$ luminescent material. Caused by this, efficiency of a light-emitting material is damaged.

w2 in the above general formula (B) corresponds to w1 in the above general formula (A). By the similar reason as that in the case of w1, the range of w2 is specified to $0<w2 \leq 0.05$. An element M for charge compensation is contained by the same amount as that of Tb. Therefore, since v2 is contained within the range in which concentration quenching of Tb does not occur similarly in the case of v1, the upper limit of the contents (v2) of Tb and M is regulated to 0.15.

The luminescent material having the composition represented by the above general formula (A) can change the second light emission peak within a peak wavelength ranging from 500 nm to 600 nm by changing the kind, the mixing ratio of the alkaline earth element and the Eu content. Therefore, this is the luminescent material having extremely high applicability. At this time, a wavelength region of the first light emission peak is a region ranging from 540 nm to 550 nm and it hardly changes, spectrum is easy to be designed. Furthermore, the luminescent material of the embodiment can be made by the same method as that of an ordinary oxide luminescent material, manufacturing at a low cost is possible.

Concretely, the luminescent material of the embodiment can be manufactured by the following method. As a starting material, an oxide powder of the constituting element can be used. The oxide powder of the constituting element is weighed by a prescribed amount, added by an appropriate amount of ammonium chloride as a crystal growth agent and mixed in a ball mill or the like. In place of the oxide powder, various compounds which can become oxides by thermal decomposition can be used also. For instance, $Tb_4O_7$ or the like as the Tb raw material, $Eu_2O_3$ or the like as the Eu raw material, $SrCO_3$ or the like as the Sr raw material, $BaCO_3$ or the like as the Ba raw material, $CaCO_3$ or the like as the Ca raw material, and $SiO_2$ or the like as the Si raw material can be used.

As the crystal growth agent, chloride, fluoride, bromide or iodide or the like of ammonium aside from ammonium chloride, and chloride, fluoride, bromide, or iodide or the like of alkaline metal can be mentioned. Furthermore, chloride, fluoride, bromide, or iodide or the like of alkaline earth metal may be used. In order to prevent increase of hygroscopicity, it is preferable that loadings of the crystal growth agent are approximately within a range from 0.01 wt % to 0.3 wt % of the total raw material powder.

The mixed raw material composed by mixing such raw material powders is housed in a container such as a crucible or the like and by carrying out the heat treatment, the primary sintered product is obtained. The heat treatment is carried out in a reducing atmosphere constituted by $N_2/H_2$ or $Ar/H_2$. This is made to synthesize a base material of the luminescent material and to promote reduction of terbium and europium in the oxides used as the raw materials. Temperature and time of the heat treatment can be made as 1,100° C. to 1,500° C., and 3 to 7 hours. The obtained primary sintered product is pulverized and housed in the container again. The pulverizing degree is not especially specified, and it is sufficient as long as a surface area is increased by pulverizing a lump of the primary sintered product by using a mortar or the like.

The pulverized primary sintered product is arranged in a furnace again, and substitution by an inert gas such as nitrogen or argon in a vacuum is carried out. In order to sufficiently remove water and oxygen or the like adhered to the material, it is desirable that the vacuum in this case is 1,000 Pa or less.

Subsequently, the secondary sintered product is obtained by carrying out the heat treatment on the pulverized primary sintered product in the reducing atmosphere constituted by $N_2/H_2$ or $Ar/H_2$. The temperature and time of the heat treatment can be made as 1,100° C. to 1,500° C. or less, and 2 to 6 hours. In this sintering, hydrogen concentration in the atmosphere is specified to be 5% or more and less than 100%. In the case the hydrogen concentration is less than 5%, it becomes difficult to completely reduce terbium from $Tb^{4+}$ to $Tb^{3+}$. Furthermore, reduction from $Eu^{3+}$ to $Eu^{2+}$ becomes also incomplete and the light-emitting intensity becomes to be reduced. By such heat treatments of two times, $Tb^{4+}$ and $Eu^{3+}$ in the luminescent material are almost completely reduced, and only $Tb^{3+}$ and $Eu^{2+}$ are obtained substantially.

By the above method, the $(Sr_{0.89}, Ba_{0.06}, Tb_{0.05})_2SiO_4$ luminescent material of the Tb concentration v1=0.05 and the Eu concentration w1=0 and the $(Sr_{0.89}, Ba_{0.06}, Eu_{0.05})_2SiO_4$ luminescent material of the Tb content v1=0 and the Eu content w1=0.05 were synthesized. Since either of Tb or Eu is not contained, these are conventional luminescent materials.

Obtained luminescent materials are excited by near-ultraviolet LED having the peak wavelength of 392 nm, and light-emitting spectrum was measured. The result is shown in FIG. 1. As illustrated, a broadband light-emitting spectrum caused by $Eu^{2+}$ of the peak wavelength of 573 nm was obtained from the $(Sr_{0.89}, Ba_{0.06}, Eu_{0.05})_2SiO_4$ luminescent material. Furthermore, the narrowband light-emitting spectrum caused by $Tb^{3+}$ of the peak wavelength of 545 nm was obtained from the $(Sr_{0.89}, Ba_{0.06}, Tb_{0.05})_2SiO_4$ luminescent material was obtained. However, the peak intensity is approximately only 3% of that in the case of the $(Sr_{0.89}, Ba_{0.06}, Eu_{0.05})_2SiO_4$ luminescent material. The light emission intensity caused by $Tb^{3+}$ from the $(Sr_{0.89}, Ba_{0.06}, Tb_{0.05})_2SiO_4$ luminescent material is found to be totally insufficient for practical application.

In general, in the luminescent material activated by terbium, the excited light is absorbed by 5d-4f transitions of $Tb^{3+}$ and the light emission is caused by 4f-4f transitions. In the excited light having the peak intensity in the long wavelength of 254 nm or more, because it does not have an absorption band in $Tb^{3+}$, the excited light can hardly be absorbed and cannot emit light. For instance, in the $LaPO_4$:Ce, Tb green luminescent material used for a three narrow emission band type(three-band) fluorescent lamp, since absorption at 254 nm by $Tb^{3+}$ is small, it co-activates $Ce^{3+}$.

In the luminescent material activated by Tb and Ce, when irradiated by the exciting light having the peak intensity in the long wavelength of 254 nm or more, $Ce^{3+}$ absorbs the exciting light, and absorbed energy shifts to $Tb^{3+}$. That is, $Ce^{3+}$ acts as a sensitizer of a doubly activated luminescent material, and the light emission intensity is increased significantly. This energy transfer of $Ce^{3+} \rightarrow Tb^{3+}$ is performed by a resonant transfer process.

By the above described manufacturing method, the $(Sr_{0.885}, Ba_{0.06}, Tb_{0.05}, Eu_{0.005})_2SiO_4$ luminescent material and the $(Sr_{0.756}, Ca_{0.189}, Tb_{0.05}, Eu_{0.005})_2SiO_4$ luminescent material were synthesized. The obtained luminescent materials were excited by the near-ultraviolet LED of the peak wavelength of 393 nm, and the light-emitting spectrum was measured. These results are shown in FIG. 2 and FIG. 3, respectively.

As shown in FIG. 2, the light emission caused by $Tb^{3+}$ of the peak wavelength of 545 nm and the light emission caused by $Eu^{2+}$ of the peak wavelength of 566 nm were obtained from the $(Sr_{0.885}, Ba_{0.06}, Tb_{0.05}, Eu_{0.005})_2SiO_4$ luminescent material. Furthermore, as shown in FIG. 3, the light emission caused by $Tb^{3+}$ of the peak wavelength of 545 nm and the light emission caused by $Eu^{2+}$ of the peak wavelength of 590 nm were obtained from the $(Sr_{0.756}, Ca_{0.189}, Tb_{0.05}, Eu_{0.005})_2SiO_4$ luminescent material. In both the $(Sr_{0.885}, Ba_{0.06}, Tb_{0.05}, Eu_{0.005})_2SiO_4$ luminescent material and the $(Sr_{0.756}, Ca_{0.189}, Tb_{0.05}, Eu_{0.005})_2SiO_4$ luminescent material, since the light emission caused by $Tb^{3+}$ and the light emission caused by $Eu^{2+}$ were hard to be separated, without co-activating Tb and Eu, the luminescent material of the same composition activated by Eu alone was synthesized, and the peak wavelength of the light emission caused by $Eu^{2+}$ was obtained.

Furthermore, the $(Sr_{0.623}, Ca_{0.267}, Tb_{0.1}, Eu_{0.01})_2SiO_4$ luminescent material and the $(Sr_{0.681}, Ca_{0.292}, Tb_{0.025}, Eu_{0.0025})_2SiO_4$ luminescent material were synthesized by the above described method. By exciting the obtained luminescent materials by the near-ultraviolet LED of the peak wavelength 391 nm, and the light-emitting spectrum was measured. These results are shown in FIG. 4 and FIG. 5, respectively.

Figure 4:
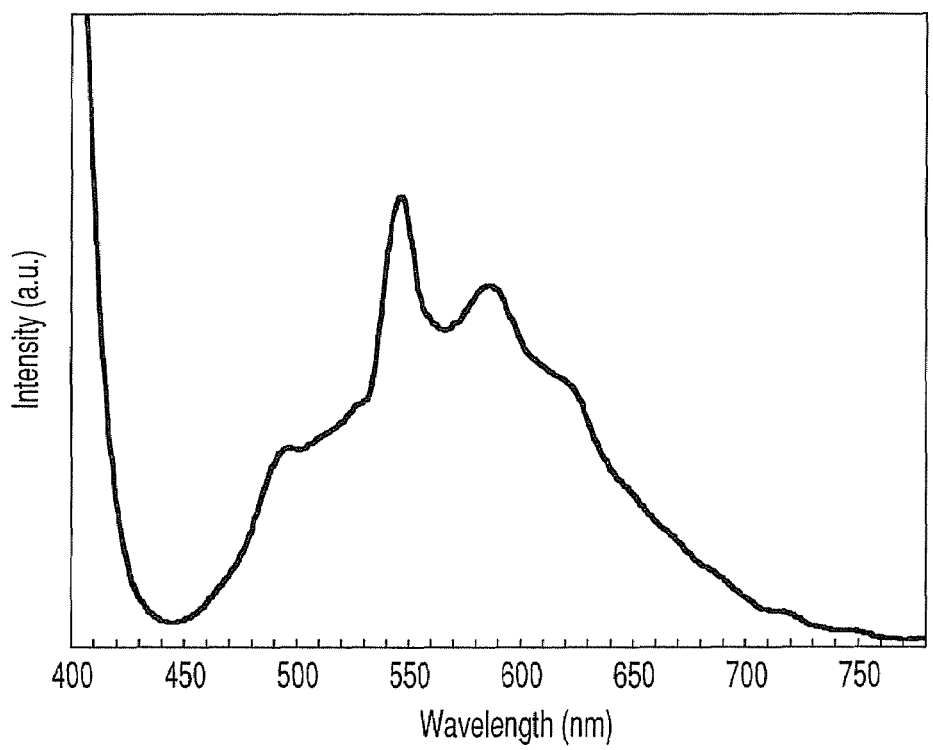
FIG. 4 is a light-emitting spectrum of a luminescent material according to another embodiment.

As shown in FIG. 4, the light emission caused by $Tb^{3+}$ of the peak wavelength 545 nm and the light emission caused by $Eu^{2+}$ of the peak wavelength 590 nm were obtained from the $(Sr_{0.623}, Ca_{0.267}, Tb_{0.1}, Eu_{0.01})_2SiO_4$ luminescent material. Furthermore, as shown in FIG. 5, the light emission caused by $Tb^{3+}$ of the peak wavelength 545 nm and the light emission caused by $Eu^{2+}$ of the peak wavelength of 585 nm were obtained from the $(Sr_{0.681}, Ca_{0.292}, Tb_{0.025}, Eu_{0.0025})_2SiO_4$ luminescent material. In the similar way as the case of FIG. 2 and FIG. 3, the luminescent material of the same composition activated only by Eu was synthesized, and the peak wavelength of the light emission caused by $Eu^{2+}$ was obtained.

Furthermore, the $(Sr_{0.832}, Ba_{0.056}, Tb_{0.05}, Eu_{0.012}, Cs_{0.05})_2SiO_4$ luminescent material and the $(Sr_{0.832}, Ba_{0.056}, Tb_{0.05}, Eu_{0.012}, Li_{0.05})_2SiO_4$ luminescent material were synthesized by the above described method. The obtained luminescent material is excited by the near ultraviolet LED of the peak wavelength of 393 nm, and the light-emitting spectrum was measured. The results are shown respectively in FIG. 6 and FIG. 7.

As shown in FIG. 6, the light emission caused by $Tb^{3+}$ of the peak wavelength of 545 nm and the light emission caused by $Eu^{2+}$ of the peak wavelength 570 nm were obtained from the $(Sr_{0.832}, Ba_{0.056}, Tb_{0.05}, Eu_{0.012}, Cs_{0.05})_2SiO_4$ luminescent material. Furthermore, as shown in FIG. 7, the light emission caused by $Tb^{3+}$ of the peak wavelength 545 nm and the light emission caused by $Eu^{2+}$ of the peak wavelength 570 nm was obtained from the $(Sr_{0.832}, Ba_{0.056}, Tb_{0.05}, Eu_{0.012}, Li_{0.05})_2SiO_4$ luminescent material. In a similar way as the cases of FIG. 2 to FIG. 5, also in the case of FIG. 6 and FIG. 7, the luminescent material of the same composition activated by only Eu was synthesized, and the peak wavelength of the light emission caused by $Eu^{2+}$ was obtained.

Subsequently, by changing the wavelength of the exciting light, the $(Sr_{0.756}, Ca_{0.189}, Tb_{0.05}, Eu_{0.005})_2SiO_4$ luminescent material was excited and the light-emitting spectrum was measured. The wavelengths of the exciting lights are made to be three kinds of 370, 400, and 440 nm. The light-emitting spectra obtained by the respectively excited light are shown in FIG. 8, FIG. 9, and FIG. 10. It is shown in these spectra that as the wavelength of the exciting light becomes longer, the light emission peak caused by $Tb^{3+}$ of the peak wavelength 545 nm is reduced. However, compared with the light-emitting spectrum in FIG. 1, the light emission peak caused by $Tb^{3+}$ is found to exist also in the exciting light of 440 nm.

Figure 11:
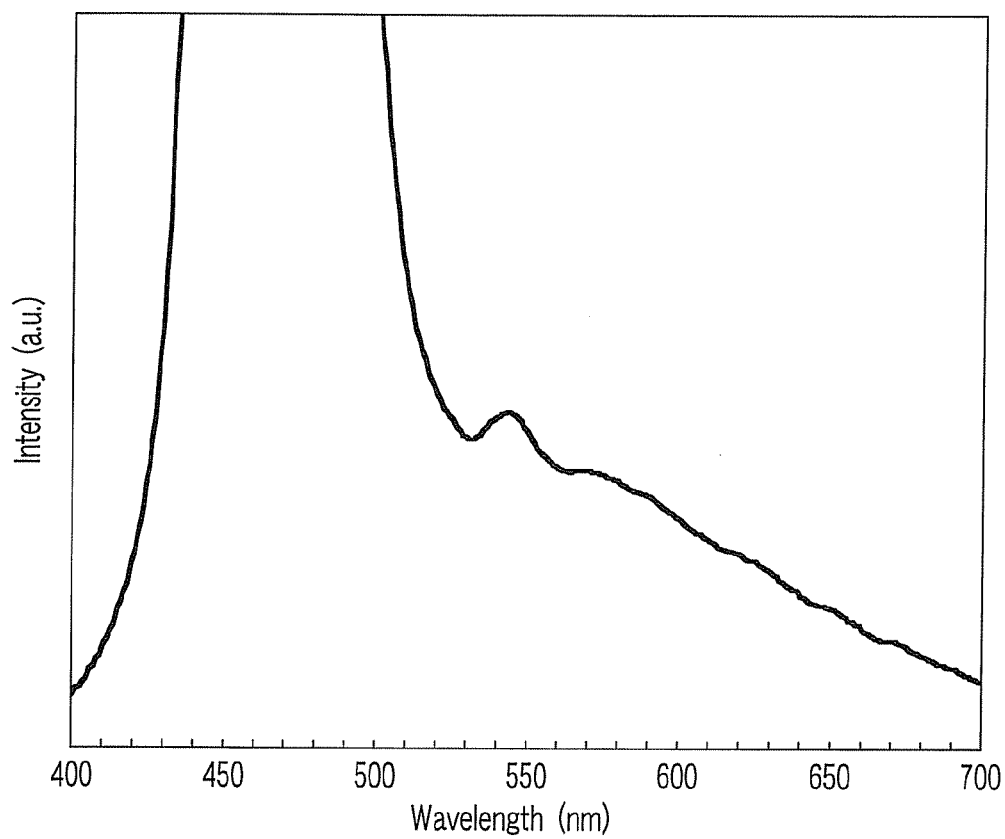
FIG. 11 is a light-emitting spectrum of a luminescent material according to another embodiment.

Furthermore, by exciting the $(Sr_{0.189}, Ca_{0.756}, Tb_{0.05}, Eu_{0.005})_2SiO_4$ luminescent material by a blue LED having the peak wavelength of 460 nm, the light-emitting spectrum was measured. That result is shown in FIG. 11. Also in the blue LED, the light emission peak caused by $Tb^{3+}$ of the peak wavelength of 545 nm was confirmed.

As described above, the luminescent material of the embodiment has the light emission peak in the specified two wavelength regions by being excited with the light having the peak wavelength ranging from 370 nm to 460 nm. Concretely, a first light emission peak is shown in the wavelength ranging from 540 nm to 550 nm, and a second light emission peak is shown in the wavelength ranging from 500 nm to 600 nm. This cause is considered as follows. That is, in the luminescent material of the embodiment, the light emission of the luminescent material activated by $Tb^{3+}$ emits light by 4f-4f transitions after absorption by 5d-4f transitions of $Tb^{3+}$. In the exciting light having the peak intensity at longer wavelength of 254 nm or more, since there is no absorption band in $Tb^{3+}$, the exciting light is hardly absorbed and the light is not emitted.

As already explained, in the case of the luminescent material added by the co-activator Ce such as $LaPO_4$:Ce, Tb green luminescent material, in exciting by the light having the peak ranging from 200 nm to 320 nm, this exciting light is absorbed and the light emission of $Tb^{3+}$ is obtained. This is caused by means that Ce acts as a sensitizer. In the luminescent material of the composition expressed by the general formula (A) activated by terbium and europium, $Eu^{2+}$ acts as a sensitizer like Ce in the $LaPO_4$:Ce, Tb green luminescent material. Otherwise, if the (Sr, Ba, Ca, Eu)$_2SiO_4$ luminescent material is activated by Tb, it is estimated that f-d energy level of $Tb^{3+}$ is reduced further than the normal level and the light of the near ultraviolet region has become absorbable.

That is, since the exciting light is absorbed by $Eu^{2+}$ and the absorbed energy shifts to $Tb^{3+}$, the light emission of $Tb^{3+}$ is obtained. Otherwise, if the (Sr, Ba, Ca, Eu)$_2SiO_4$ luminescent material is activated by Tb, it is estimated that Tb directly absorbs the exciting light, and the light emission of $Tb^{3+}$ is obtained. When the excited spectrum of the luminescent material of the composition represented by the above general formula (A) is measured, it was confirmed that absorption exists up to the vicinity of 500 nm. The excited spectrum can be obtained by carrying out measurement of the luminescent material powder by a diffusion and dispersion method by a Hitachi Ltd. F-3000 Fluoro-spectrophotometer, for instance.

Figure 12:
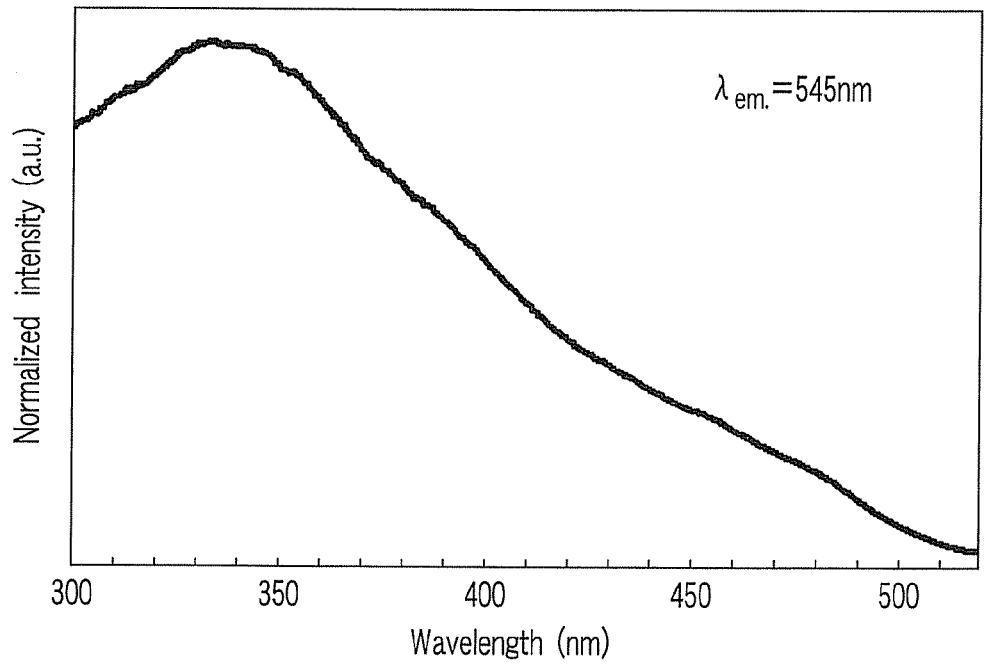
FIG. 12 is an excitation spectrum of a luminescent material according to another embodiment.

In FIG. 12, the excited spectrum observing the light emission of 545 nm of the $(Sr_{0.885}, Ba_{0.06}, Tb_{0.05}, Eu_{0.005})_2SiO_4$ luminescent material is shown. According FIG. 12, it is found that in the $(Sr_{0.885}, Ba_{0.06}, Tb_{0.05}, Eu_{0.005})_2SiO_4$ luminescent material, excitation is possible in the wavelength ranging from 300 nm to 520 nm. However, if actually excited by the excitation wavelength over 460 nm, only the broadband light emission caused by $Eu^{2+}$ is obtained and the narrowband light emission caused by $Tb^{3+}$ characteristic to the embodiment of the present invention is not obtained. From this result, the luminescent material of the embodiment is found to be capable of excitation by the excitation wavelength up to 460 nm.

Furthermore, in order to identify the crystal phases of the $(Sr_{0.885}, Ba_{0.06}, Tb_{0.05}, Eu_{0.005})_2SiO_4$ luminescent material and the $(Sr_{0.832}, Ba_{0.056}, Tb_{0.05}, Eu_{0.012}, Cs_{0.05})_2SiO_4$ luminescent material, the diffraction pattern was measured by a powder x-ray diffraction analysis method (x-ray diffractometry: XRD) and the identified by comparing the measured diffraction pattern a Joint Committee on Powder Diffraction Standards (JCPDS) card.

The XRD measurement enables to measure the diffraction pattern of a luminescent material sample by, for instance, a MAC/Science Company Co. Ltd (Bruker AXS K. K.) M18XHF$^{22}$-SRA or the like, and to carry out comparison with that of the JCPDS card.

Figure 14:
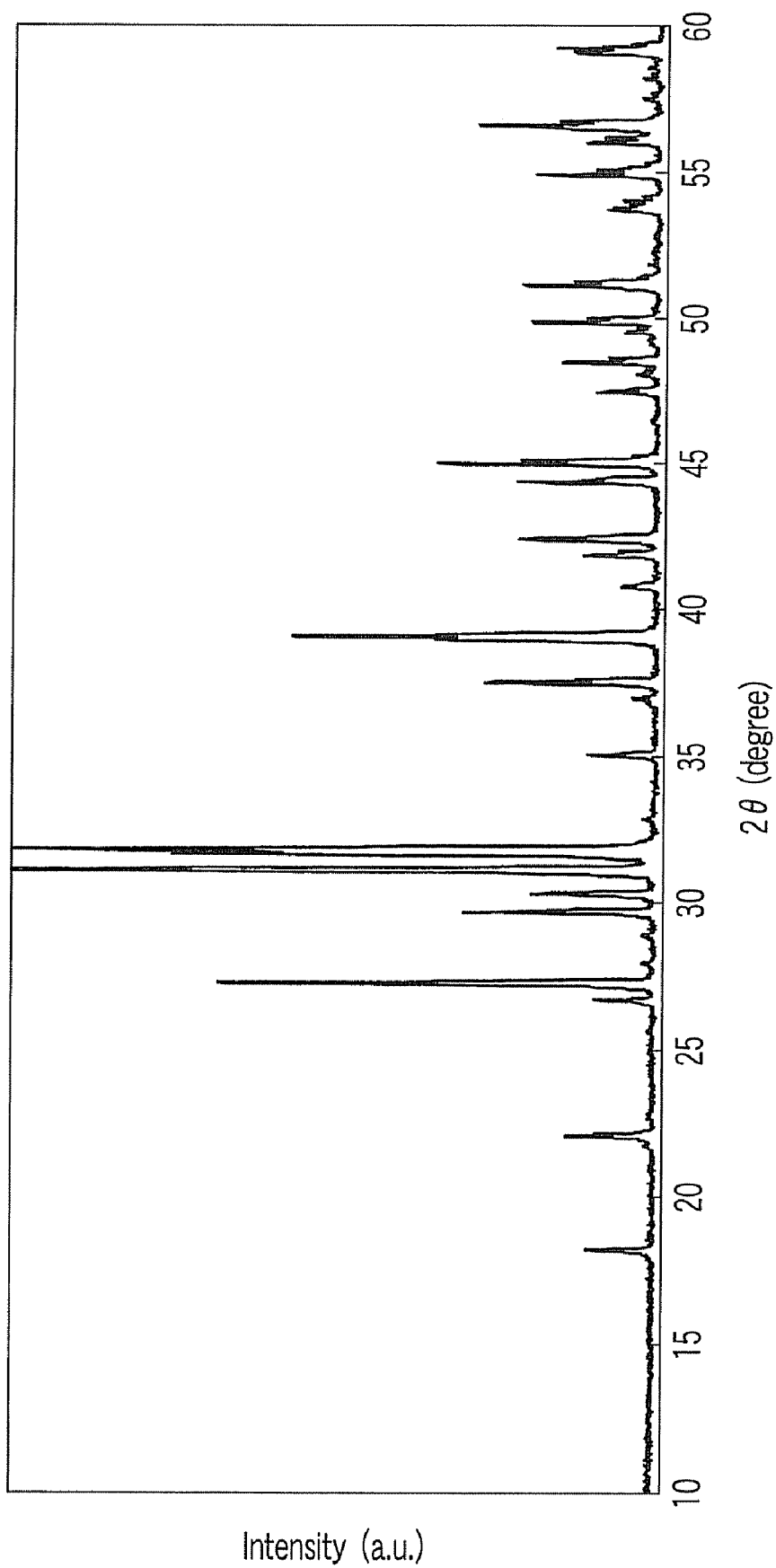
FIG. 14 is an X-ray diffraction pattern of a luminescent material according to another embodiment.

The XRD measurement was carried out on the $(Sr_{0.885}, Ba_{0.06}, Tb_{0.05}, Eu_{0.005})_2SiO_4$ luminescent material and the $(Sr_{0.832}, Ba_{0.056}, Tb_{0.05}, Eu_{0.012}, Cs_{0.05})_2SiO_4$ luminescent material. The obtained X-ray diffraction patterns are shown respectively in FIG. 13 and FIG. 14. The obtained diffraction pattern was almost coincided with the diffraction pattern of the orthorhombic crystal $Sr_2SiO_4$ phase of the JCPDS card #39-1256. From this result, in the $(Sr_{a1}, Ba_{b1}, Ca_{c1}, Tb_{v2}, Eu_{w1})_2SiO_4$ luminescent material activated by terbium and europium, Sr, Ba, Tb and Eu are found to be solid solved. Furthermore, in the $(Sr_{a2}, Ba_{b2}, Ca_{c2}, Tb_{v2}, Eu_{w2}, M_{v2})_2SiO_4$ luminescent material activated by terbium, europium, and cesium, Sr, Ba, Tb, Eu, and Cs are found to be solid solved.

In the $(Sr_{0.885}, Ba_{0.06}, Tb_{0.05}, Eu_{0.005})_2SiO_4$ luminescent material which is not added by the charge compensation agent, a minute amount of $Tb_2O_3$ phase is also confirmed. This is found from a diffraction peak in the vicinity of 29° and 33° of FIG. 13.

The $(Sr_{0.832}, Ba_{0.056}, Tb_{0.05}, Eu_{0.012}, Cs_{0.05})_2SiO_4$ luminescent material added by Cs as the charge compensation agent becomes to have almost a $Sr_2SiO_4$ single phase. This is found since the diffraction pattern except the $Sr_2SiO_4$ phase cannot be confirmed in FIG. 14. From such result, it is estimated that generation of a hetero phase is suppressed by adding the charge compensation agent.

In either one of the $(Sr_{0.885}, Ba_{0.06}, Tb_{0.05}, Eu_{0.005})_2SiO_4$ luminescent material and the $(Sr_{0.832}, Ba_{0.056}, Tb_{0.05}, Eu_{0.012}, Cs_{0.05})_2SiO_4$ luminescent material, when excited by the light having the light emission peak at 393 nm, the light emission of the narrowband spectrum caused by Tb is confirmed. The Tb light emission of the luminescent material of the embodiment is considered to be the light emission not from the $Tb_2O_3$ phase but from the main phase $Sr_2SiO_4$. From this result, it is estimated that the light emission obtained by exciting the $(Sr_{a2}, Ba_{b2}, Ca_{c2}, Tb_{v2}, Eu_{w2}, M_{v2})_2SiO_4$ luminescent material is singly by the $(Sr_{a2}, Ba_{b2}, Ca_{c2}, Tb_{v2}, Eu_{w2}, M_{v2})_2SiO_4$ luminescent material.

The main (crystal) phase here means the crystal phase of which the diffraction peaks are coincided with the most and of which the peak intensity is large of all the crystal phases which are included and identified in the diffraction patterns obtained by the XRD measurement.

Furthermore, fluorescence microscope observation was carried out on the $(Sr_{0.885}, Ba_{0.06}, Tb_{0.05}, Eu_{0.005})_2SiO_4$ luminescent material. The microscope observation was carried out by observing the light emission of the luminescent material by the exciting light of 365 nm by, for instance, a Nikon Corporation ECLIPSE80i or the like on the synthesized luminescent material sample. From the result of the fluorescence microscope observation, it was confirmed that the synthesized $(Sr_{0.885}, Ba_{0.06}, Tb_{0.05}, Eu_{0.005})_2SiO_4$ luminescent material is composed of particles having a diameter of approximately from around 10 to 30 μm and emitting light homogeneously by the excited light of 365 to 435 nm.

Figure 15:
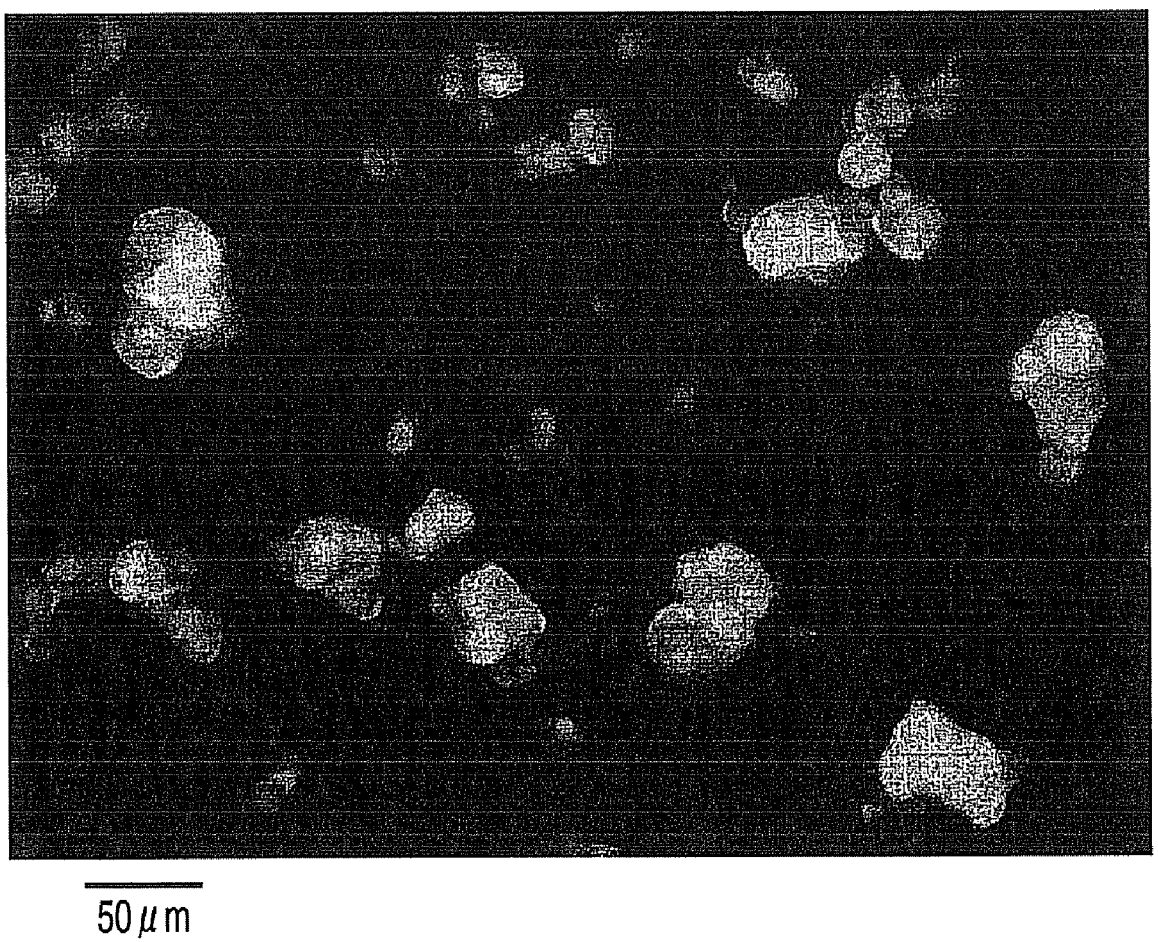
FIG. 15 is a microphotograph by 365 nm excitation of the luminescent material according to another embodiment.

In FIG. 15, the result of the microscope observation by the 365 nm excitation of the $(Sr_{0.885}, Ba_{0.06}, Tb_{0.05}, Eu_{0.005})_2SiO_4$ luminescent material is shown.

Furthermore, on the surface of the luminescent material particles manufactured by the embodiment, in the need of moisture prevention or the like, a surface layer material composed of at least one selected from a silicone resin, an epoxy resin, a fluororesin, tetraethoxy silane (TEOS), silica, zinc silicate, aluminum silicate, calcium polyphosphate, silicone oil, and silicone grease is sometimes coated. Zinc silicate and aluminum silicate are represented respectively by, for instance, $ZnO \cdot cSiO_2 (1 \leq c \leq 4)$ and $Al_2O_3 \cdot dSiO_2 (1 \leq d \leq 10)$. The surface of the luminescent material particles is not need to be covered completely with the surface layer material, and a part thereof may be exposed. If the surface layer material composed of the above described material exists on the surface of the luminescent material particles, that effect is obtained. The surface layer material can be arranged on the luminescent material particle surface by using that dispersion liquid or solution. The surface layer material is arranged by drying through heating or the like after immersing the particles into the dispersion liquid or the solution for a prescribed time. In order to obtain the effect of the surface layer material without damaging the original function as the luminescent material, it is preferable that the surface layer material exists by the volume ratio of around 0.1 to 5% of the luminescent material particles.

As described above, if the luminescent material activated by terbium and europium, especially alkaline earth orthosilicate luminescent material activated by terbium and europium is excited by the exciting light having the peak wavelength ranging from 370 nm to 460 nm, light emission peaks are shown in two specified wavelength regions. A first light emission peak appears in the wavelength ranging from 540 nm to 550 nm, and a second light emission peak appears in the wavelength ranging from 500 to 600 nm. Furthermore, by combining the luminescent material of the embodiment with the light-emitting element having the light emission peak in the wavelength ranging from 370 nm to 460 nm, the light-emitting device of high efficiency and high color rendering properties is obtained. As the light-emitting element, either of LED chip and a laser diode may be used. In the light-emitting device according to the embodiment, the average color rendering evaluation number Ra of 60 or more is obtained. This is mainly caused by the narrowband light emission in the vicinity of 490 nm by terbium used as the activator. The light emission in the vicinity of 490 nm has the effect of filling a gap between the light emission of the blue region and the green or the yellow region, used to create white color, to enhance the value of Ra for that reason.

The luminescent material according to the embodiment is the green to yellow based luminescent material which emits luminescence of green-yellow color. Therefore, by using it in combination with the blue based luminescent material which emits luminescence of blue color and the red based luminescent material which emits luminescence of red color, the white light-emitting device can be obtained. For instance, in the case a light source of the blue region is used, by combining the luminescent material of the embodiment and the red based luminescent material, the white light-emitting device can be provided. Furthermore, in the case the light source of near ultraviolet region is used, in addition to the luminescent material of the embodiment, by combining it with the blue based luminescent material and the red based luminescent material, the white light-emitting device can be provided.

The blue based luminescent material can be said to be the luminescent material having the main light emission peak in the wavelength region from blue violet to blue ranging from 430 nm to 510 nm. As the blue based luminescent material, for instance, a halophosphate luminescent material such as (Sr, Ca, Ba, Mg)$_5$(PO$_4$)$_3$(Cl, Br):Eu, (Sr, Ca, Ba, Mg)$_5$(PO$_4$)$_3$Cl:Eu, a phosphate luminescent material such as 2SrO·0.84P$_2$O$_5$·0.16B$_2$O$_3$:Eu, and an alkaline earth metal aluminate luminescent material such as BaMgAl$_{10}$O$_{17}$:Eu, BaMg$_2$Al$_{16}$O$_{27}$:Eu, BaMgAl$_{10}$O$_{17}$:Eu, Mn are mentioned. Furthermore, the main light emission peak regarding the luminescent material and the light-emitting element means the wavelength in which the peak intensity of the light-emitting spectrum becomes the largest and which is previously reported in documents and patents or the like. Changes or the like of the light emission peak of around 10 nm caused by a small amount of element addition or a slight composition shift in making the luminescent material can be regarded within the main light-emission peak previously reported.

The red based luminescent material can be said to be the luminescent material having the main light emission peak in the wavelength region from orange to red ranging from 580 nm to 680 nm. As the red luminescent material, for instance, a silicate luminescent material such as (Sr, Ca, Ba)$_2$SiO$_4$:Eu, an acid fluoride luminescent material such as 3.5MgO·0.5MgF·GeO$_2$:Mn, an oxide luminescent material such as YVO$_4$:Eu, an acid sulfide luminescent material such as (La, Gd, Y)$_2$O$_2$S:Eu, a sulfide luminescent material such as (Ca, Sr, Ba)S:Eu, and a nitride luminescent material such as (Sr, Ba, Ca)$_2$Si$_5$N$_8$:Eu and (Sr, Ca)AlSiN$_3$:Eu can be used.

Figure 16:
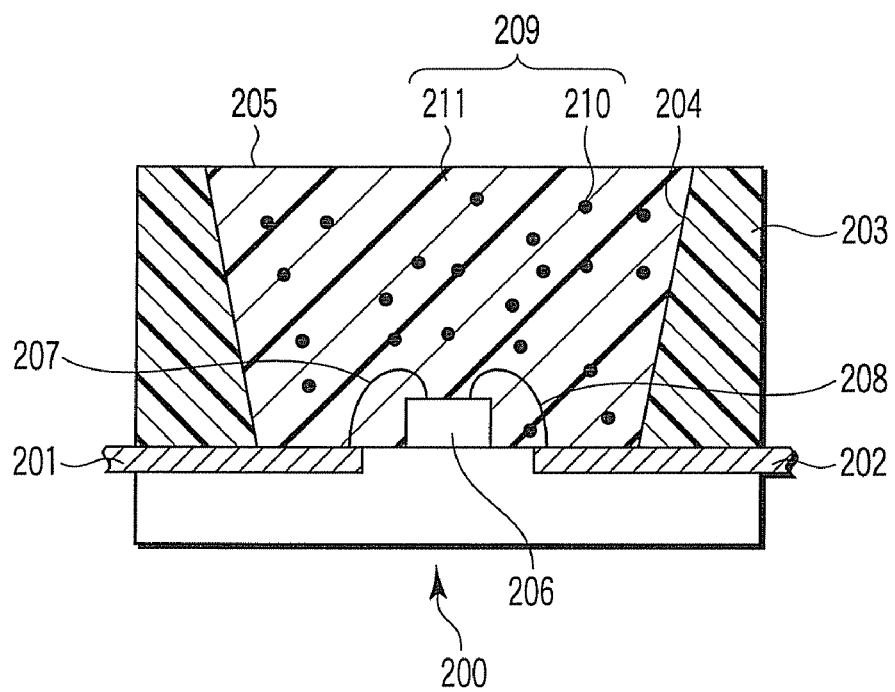
FIG. 16 is a cross-sectional view of a light-emitting device according to one embodiment.

As shown in cross-section view shown in FIG. 16, the light-emitting device of the embodiment has a lead 201 and a lead 202 in which a resin stem 200 is composed by molding a lead frame and a resin part 203 integrally molded with this. The resin part 203 has a recess 205 in which the upper opening part is wider than that of the bottom face part, and a reflecting surface 204 is installed at the side of this recess.

A semiconductor light-emitting element 206 is bonded on the center of the approximately circular bottom face of the recess 205 by Ag paste or the like. As the semiconductor light-emitting element 206, that which performs ultraviolet light emission or that which performs light emission in visible light region can be used. For instance, the semiconductor light-emitting diode or the like such as GaAs based one and GaN based one can be used. An electrode (not shown) of the semiconductor light-emitting element 206 is connected respectively to the lead 201 and the lead 202 by bonding wires 207 and 208 composed of Au or the like. Furthermore, the arrangement of the lead 201 and 202 can be changed depending upon circumstances.

A luminescent layer 209 is provided in the recess 205 of the resin part 203. This luminescent layer 209 can be formed by dispersing the luminescent material 210 of the embodiment at the content of 5 to 50 wt % in a resin layer 211 composed of for instance a silicone resin. The luminescent material can be adhered by various binders such as the resin which is an organic material or glass which is an inorganic material.

As the binder of the organic material, apart from the above described silicone resin, a transparent resin superior in light resistance such as epoxy resin and acrylic resin is suitable. As the binder of the inorganic material, a low-melting point glass or the like using an alkaline earth borate or the like, ultrafine particle silica and alumina or the like in order to adhere the luminescent material of a large particle diameter, and an alkaline earth phosphate or the like obtained by a precipitation method are suitable. These binders may be used by one or in combination with two or more.

Furthermore, as the luminescent material used for the luminescent layer, a coating treatment can be applied on the surface if necessary. By this surface coating, the luminescent material is prevented from being degraded because of external factors such as heat, humidity, and ultraviolet rays. Furthermore, dispersibility of the luminescent material is enabled to be adjusted, and a design of the luminescent layer can be carried out easily.

As the semiconductor light-emitting element 206, it is also possible to use a flip chip type having an n-type electrode and a p-type electrode on the same surface. In this case, problems attributed to the wire such as disconnection and detachment of the wire and light absorption by the wire are solved, and the semiconductor light-emitting device of high reliability and high brightness is obtained. Furthermore, by using an n-type substrate for the semiconductor light-emitting element 206, the following constitution is also made possible. Concretely, the n-type electrode is formed on the rear face of the n-type substrate, the p-type electrode is formed on the upper surface of the semiconductor layer formed on the substrate, and the n-type electrode or the p-type electrode is bonded on the lead. The p-type electrode or the n-type electrode can be connected to the other lead by the wire. The size of the semiconductor light-emitting element 206, and the dimension and the shape of the recess 205 can be changed depending upon circumstances.

Figure 17:
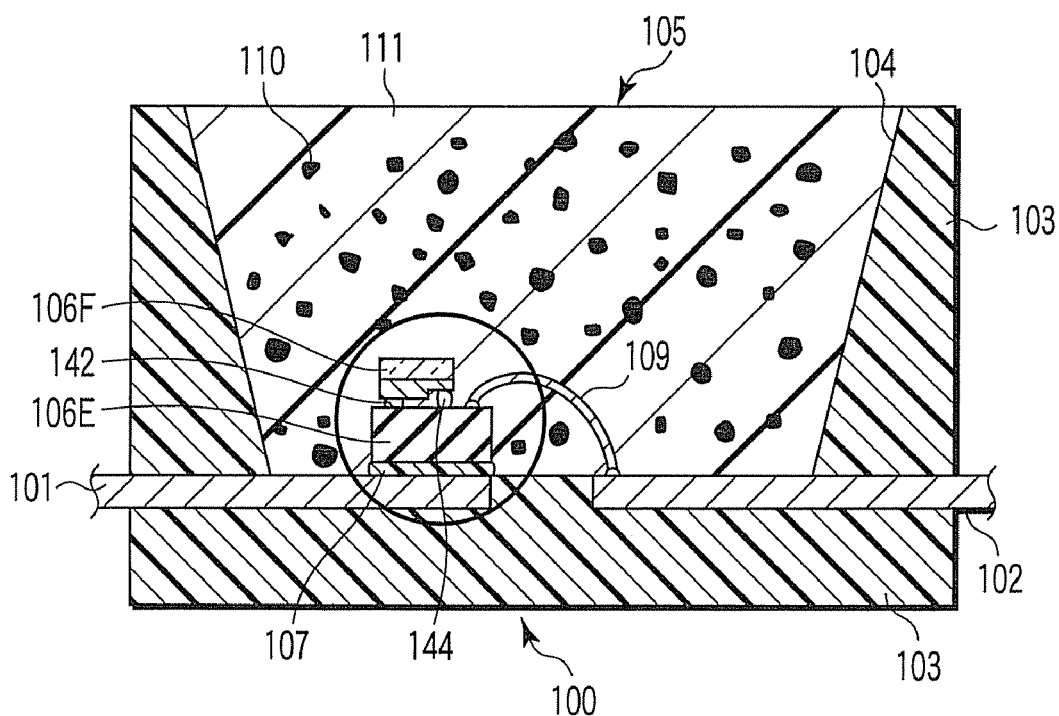
FIG. 17 is a cross-sectional view of a light-emitting device according to another embodiment.

As shown in a cross-section view of FIG. 17, the light-emitting device of the embodiment has a resin stem 100, the semiconductor light-emitting element 106F bonded on it, and a sealing body 111 to cover this semiconductor light-emitting element 106F. The sealing resin stem 100 has the leads 101 and 102 formed by the lead frame, and the resin part 103 molded integrally with these. The leads 101 and 102 are arranged with one ends of respective leads adjacent and opposed. The other ends of the leads 101 and 102 are extended and exist in mutually opposite directions and led out to the outside from the resin part 103.

The recess 105 is installed at the resin part 103 and a protective zener diode 106E is bonded on the bottom of the recess by an adhesive 107. The semiconductor light-emitting element 106F is located on a protective zener diode 106E. That is, the diode 106E is bonded on the lead 101. The wire 109 is connected from the diode 106E to the lead 102.

The semiconductor light-emitting element 106F is surrounded by the inner side of the resin part 103, and this inner side is inclined toward a light extraction direction and acts as the reflecting face 104 to reflect light. The sealing body 111 filled in the recess 105 contains the luminescent material 110. The semiconductor light-emitting element 106F is arranged on the protective zener diode 106E. The luminescent material according to the embodiment is used as the luminescent material 110.

Figure 18:
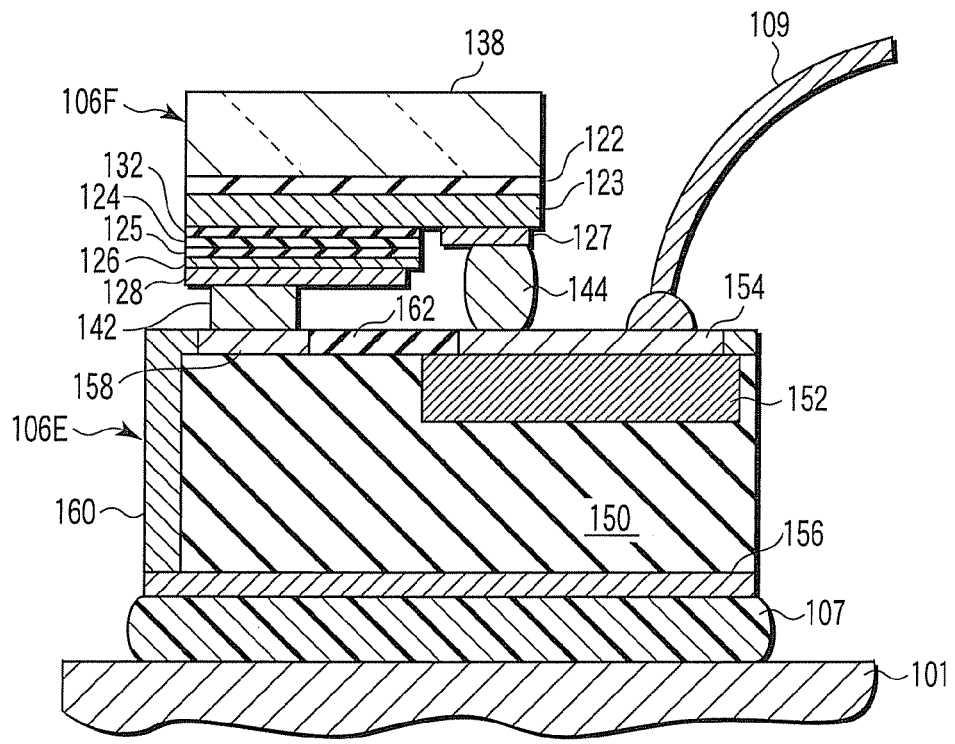
FIG. 18 is an enlarged view of a light-emitting element.

As shown in enlarged view of FIG. 18, the protective diode 106E has a planar structure in which a p-type region 152 is formed on the surface of an n-type silicon substrate 150. A p-side electrode 154 is formed in the p-type region 152, and an n-side electrode 156 is formed on the rear face of the substrate 150. Opposed to this n-side electrode 156, the n-side electrode 158 is also formed on the surface of the diode 106E. Such two n-side electrodes 156 and 158 are connected by a wiring layer 160 formed at the side of the diode 106E. Furthermore, a highly reflecting film 162 is formed on the surface of the diode 106E at which the p-side electrode 154 and the n side electrode 158 are installed. The highly reflecting film 162 has a high reflectivity to light emitted from the light-emitting element 106F.

In the semiconductor light-emitting element 106F, a buffer layer 122, an n-type contact layer 123, an n-type clad layer 132, an active layer 124, a p-type clad layer 125, and a p-type contact layer 126 are successively formed on a transparent substrate 138. Furthermore, the n-side electrode 127 is formed on the n-type contact layer 123, and the p-side electrode 128 is formed on the p-type contact layer 126. The light emitted from the active layer 124 is extracted by transmitting the transparent substrate 138.

The light-emitting element 106F having such structure is flip chip bonded on the diode 106E via a bump. Concretely, by the bump 142, the p-side electrode 128 of the light-emitting element 106F is electrically connected to the n-side electrode 158 of the diode 106E. Furthermore, by the bump 144, the n-side electrode 127 of the light-emitting element 106F is electrically connected to the p-side electrode 154 of the diode 106E. On the p-side electrode 154 of the diode 106E, a wire 109 is bonded, and this wire 109 is connected to the lead 102.

Figure 19:
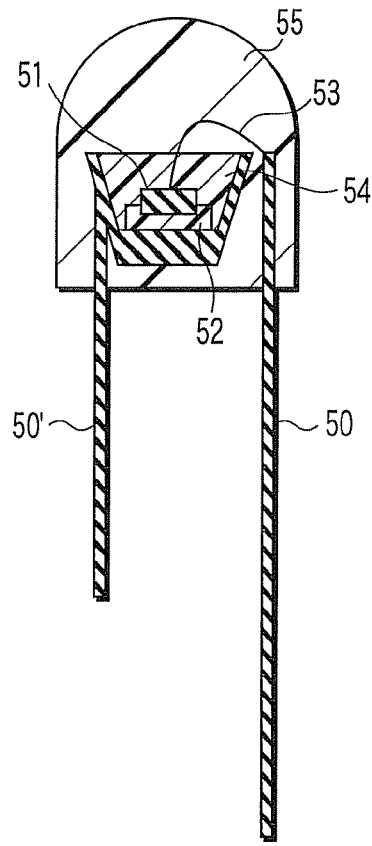
FIG. 19 is a cross-sectional view of a light-emitting device according to another embodiment.

As shown in FIG. 19, in a lead-type light-emitting device, the semiconductor light-emitting element 51 is arranged on the lead 50' via a bond material 52, and covered by a pre-dip material 54. The lead 50 is connected to the semiconductor light-emitting element 51 by a wire 53, and sealed by a casting material 55. In the pre-dip material 54, the luminescent material of the embodiment is contained.

As described above, the light-emitting device of the embodiment, for instance, the white LED has light of the narrowband spectrum. Because of this, this device is most suitable not only as an ordinary illumination application such as a fluorescent lamp but also as a light-emitting device used by combining a filter such as a color filter and the light source, for instance, the light source or the like for a backlight for a liquid crystal. Since a conventional white LED has the light of the broadband spectrum, in the case the white LED and the color filter are combined, it had a shortcoming that most of the light emitted from the white LED as the light source was absorbed by the filter.

However, since the white LED of the embodiment has the light of the narrowband spectrum when combined with the filter, a specific wavelength can be utilized efficiently. Concretely, this device is most suitable for a backlight of a liquid crystal and a green component of an inorganic electroluminescent device using the blue light-emitting layer.

This invention will be explained further in details by showing examples and comparative examples below, but this invention is not limited to the following examples as long as it does not exceed its purpose.

EXAMPLE 1

The $(Sr_{0.885}, Ba_{0.06}, Tb_{0.05}, Eu_{0.005})_2SiO_4$ luminescent material was prepared. As the raw material powder, $SrCO_3$ powder 55.8 g, $BaCO_3$ powder 5.0 g, $SiO_2$ powder 13.5 g, $Tb_4O_7$ powder 4.0 g, and $Eu_2O_3$ powder 0.4 g were provided. Furthermore, by adding 0.6 g of $NH_4Cl$ as a crystal growth agent, this is mixed uniformly by a ball mill.

The obtained mixed raw material was housed in a crucible as a sintering container, and sintered in the following conditions. Firstly, a primary sintered product was obtained by sintering the material at 1,100° C. to 1,500° C. for 3 to 7 hours in a reducing atmosphere constituted by $N_2/H_2$. The primary sintered product was pulverized and housed in a crucible again, and arranged in a furnace and the inside of the furnace is nitrogen-substituted in a vacuum. Furthermore, a secondary sintered product was obtained by sintering the primary product at 1,100° C. to 1,500° C. for 2 to 6 hours in the reduced atmosphere composed of $N_2/H_2$ containing hydrogen at the concentration of 5% or more and less than 99%.

The obtained secondary sintered product was pulverized in water, and after filtration, dewatered by suction filtration.

Finally, the product was dried at 150° C. in a drier, furthermore making it pass through a sieve, and the luminescent material of the embodiment was obtained. As a result of carrying out a quantitative analysis on the obtained luminescent material of the example 1 by ICP emission spectrometry, it was confirmed that it had the composition nearly conforming to the charged one.

Furthermore, by changing the content of the constituting elements as shown in the following Table 1, the luminescent materials of the examples 2 to 13 and comparative examples 1, 2 were synthesized. Eu is not contained in the luminescent material of the comparative example 1, and Tb is not contained in the luminescent material of the comparative example 2.

TABLE 1

| | Fluorescent substance composition |
|---|---|
| Example 2 | $(Sr_{0.879},Ba_{0.059},Tb_{0.05},Eu_{0.012})_2SiO_4$ |
| Example 3 | $(Sr_{0.867},Ba_{0.059},Tb_{0.05},Eu_{0.024})_2SiO_4$ |
| Example 4 | $(Sr_{0.756},Ca_{0.189},Tb_{0.05},Eu_{0.005})_2SiO_4$ |
| Example 5 | $(Sr_{0.189},Ca_{0.756},Tb_{0.05},Eu_{0.005})_2SiO_4$ |
| Example 6 | $(Sr_{0.473},Ca_{0.472},Tb_{0.05},Eu_{0.005})_2SiO_4$ |
| Example 7 | $(Ba_{0.189},Ca_{0.756},Tb_{0.05},Eu_{0.005})_2SiO_4$ |
| Example 8 | $(Sr_{0.623},Ca_{0.267},Tb_{0.1},Eu_{0.01})_2SiO_4$ |
| Example 9 | $(Sr_{0.626},Ca_{0.269},Tb_{0.1},Eu_{0.005})_2SiO_4$ |
| Example 10 | $(Sr_{0.681},Ca_{0.292},Tb_{0.025},Eu_{0.002})_2SiO_4$ |
| Example 11 | $(Sr_{0.832},Ba_{0.056},Tb_{0.05},Eu_{0.012},Cs_{0.05})_2SiO_4$ |
| Example 12 | $(Sr_{0.839},Ba_{0.056},Tb_{0.05},Eu_{0.005},Cs_{0.05})_2SiO_4$ |
| Example 13 | $(Sr_{0.839},Ba_{0.056},Tb_{0.05},Eu_{0.005},Li_{0.05})_2SiO_4$ |
| Comparative example 1 | $(Sr_{0.89},Ba_{0.06},Tb_{0.05})_2SiO_4$ |
| Comparative example 2 | $(Sr_{0.76},Ba_{0.19},Eu_{0.05})_2SiO_4$ |

As has been explained by referring to FIG. 1, in the case Eu is not contained, light emission characteristic to Tb is extremely small and not practical. On the other hand, in the case Tb is not contained, only the emission of light of broadband caused by Eu is confirmed. In either case, light emission peaks can not be obtained within the two specific wavelength regions.

On the contrary, in the case of luminescent materials of the examples, both of narrowband spectrum and broadband spectrum can be obtained. This can be estimated, for instance, from the emission spectrum of $(Sr_{0.885}, Ba_{0.06}, Tb_{0.05}, Eu_{0.005})_2SiO_4$ luminescent material of the example 1 shown in FIG. 2.

The $(Sr_{0.885}, Ba_{0.06}, Tb_{0.05}, Eu_{0.005})_2SiO_4$ luminescent material of the example 1, a commercially available blue color luminescent material $BaMgAl_{10}O_{17}$:Eu luminescent material, and a red color nitride luminescent material $Sr_2Si_5N_8$:Eu luminescent material are mixed, thereby obtaining a luminescent material mixture. This luminescent material mixture is dispersed in an epoxy resin to prepare a resin mixture.

The obtained resin mixture is combined with a LED chip of peak wavelength of 393 nm to fabricate a white color LED light-emitting device. Concretely, this constitutes a light-emitting device with a structure referred to as a flip chip, in which LED chips are bonded via bumps as shown in FIG. 17. This white color LED device is taken for example 14.

Emission spectrum of the white color LED device of the example 14 when the mixing ratio of the luminescent material was adjusted and color temperature was adjusted to 3,500K is shown in FIG. 20. Furthermore, emission spectrum when the color temperature was adjusted to 4,200K is shown in FIG. 21. The average color rendering index was Ra=92.3 when the color temperature of the white color LED light-emitting device was adjusted to 3,500K. The average color rendering index was Ra=90.2 when the color temperature of the white color LED light-emitting device was adjusted to 4,200K. The average color rendering index Ra was obtained by the emission spectrum obtained from the white color LED emission device. Since the average color rendering index Ra is 90 or more, the light-emitting device of the present example has an extremely high color rendering property that can be applicable for practical use such as usage for illumination or the like.

Subsequently, a resin mixture is prepared in a same procedure as description above except that the luminescent material of the example 1 is replaced by $(Sr_{0.75}, Ba_{0.19}, Eu_{0.05})_2SiO_4$ luminescent material of the comparative example 2. A white color LED light-emitting device is fabricated in a similar method as above described except that the obtained resin mixture is used. This white color LED device is taken as a comparative example 3.

Figure 22:
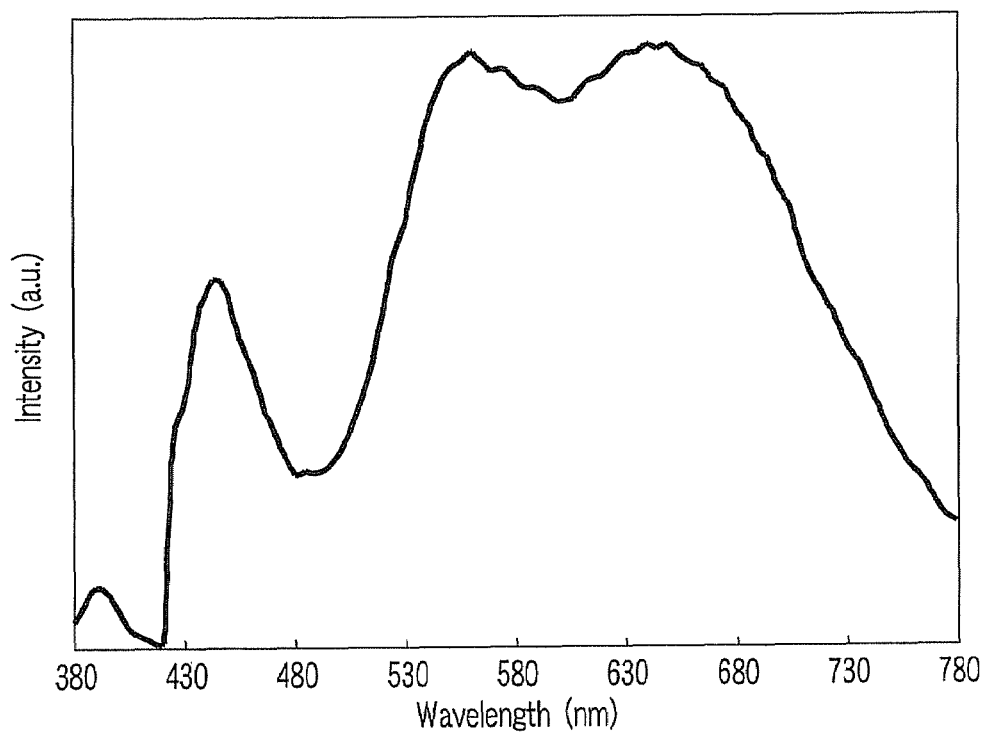
FIG. 22 is a light-emitting spectrum of a white LED using a conventional luminescent material.
Figure 23:
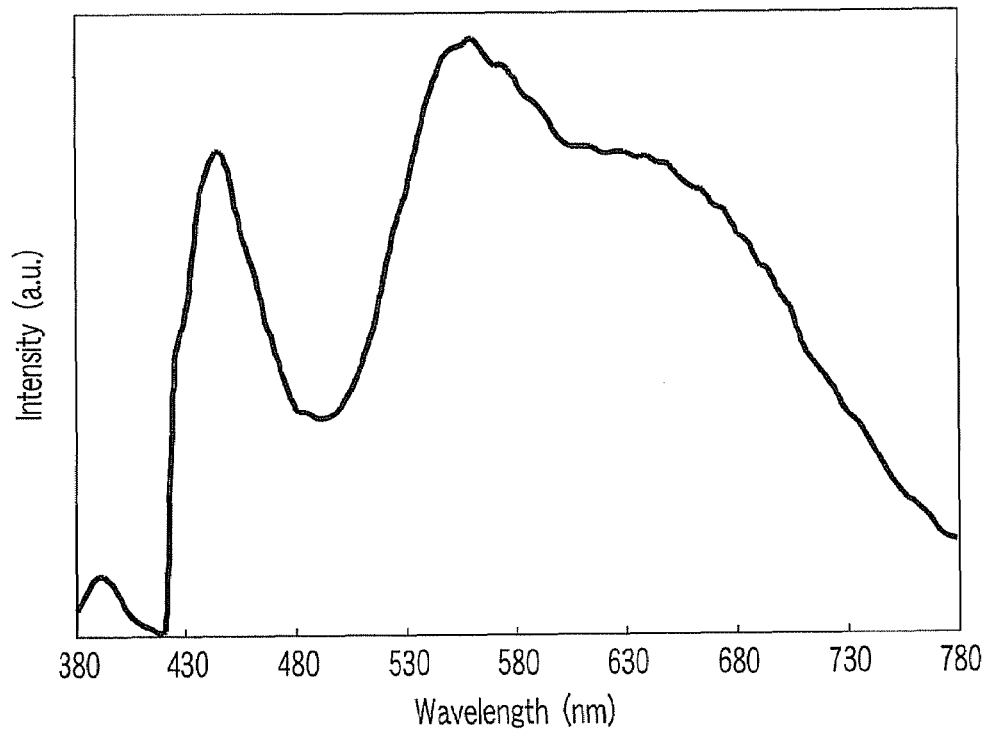
FIG. 23 is a light-emitting spectrum of a white LED using a conventional luminescent material.

Emission spectrum of the white color LED device of the comparative example 3 when the color temperature is adjusted to 3,500K is shown in FIG. 22. Furthermore, the emission spectrum when color temperature is adjusted to 4,200K is shown in FIG. 23. The average color rendering index was Ra=84.8 when color temperature of the white color LED light-emitting device is adjusted to 3,500K. The average color rendering index was Ra=82.5 when color temperature of the white color LED light-emitting device was adjusted to 4,200K.

As is apparent from comparison of the example 14 and the comparative example 3, it is found that the white color LED device using the luminescent material of the example shows a more superior average color rendering index Ra than that of the comparative example in either of the white color LED devices adjusted to color temperature 3,500K or color temperature 4,200K.

Furthermore, light-emitting devices for examples 15 to 26 are fabricated by using the luminescent materials of the examples 2 to 13, the blue color luminescent material, and the red color luminescent material, and combining them with near-ultra-violet LED chips as shown in a following Table 2. Concretely, a resin containing luminescent material was casted to LED chips bonded on a frame, and a light-emitting device of a lead shaped structure as shown in FIG. 19 was fabricated.

Furthermore, $BaMgAl_{10}O_{17}$:Mn, Eu green color luminescent material, blue color luminescent material, red color luminescent material, and near-ultra-violet LED chips are combined, and a light-emitting device of a comparative example 4 was fabricated in a similar method of the above description.

In the light-emitting devices of the examples 15 to 26 and the comparative example 4, the mixing ratio of luminescent materials was adjusted and the color temperature is adjusted to 4,200K.

TABLE 2

| | Peak wavelength of exciting light (nm) | Used fluorescent substance |
|---|---|---|
| Example 15 | 390 | $BaMgAl_{10}O_{17}$:Eu + Example 2 + $CaAlSiN_3$:Eu |
| Example 16 | 392 | $BaMgAl_{10}O_{17}$:Eu + Example 3 + $CaAlSiN_3$:Eu |
| Example 17 | 393 | $BaMgAl_{10}O_{17}$:Eu + Example 4 + $CaAlSiN_3$:Eu |
| Example 18 | 393 | $BaMgAl_{10}O_{17}$:Eu + Example 5 + $La_2O_2S$:Eu |
| Example 19 | 392 | $BaMgAl_{10}O_{17}$:Eu + Example 6 + $La_2O_2S$:Eu |
| Example 20 | 392 | $BaMgAl_{10}O_{17}$:Eu + Example 7 + $Sr_2Si_5N_8$:Eu |
| Example 21 | 393 | $BaMgAl_{10}O_{17}$:Eu + Example 8 + $CaAlSiN_3$:Eu |
| Example 22 | 393 | $BaMgAl_{10}O_{17}$:Eu + Example 9 + $Sr_2Si_5N_8$:Eu |
| Example 23 | 393 | $BaMgAl_{10}O_{17}$:Eu + Example 10 + $CaAlSiN_3$:Eu |
| Example 24 | 393 | $BaMgAl_{10}O_{17}$:Eu + Example 11 + $CaAlSiN_3$:Eu |
| Example 25 | 392 | $BaMgAl_{10}O_{17}$:Eu + Example 12 + $Sr_2Si_5N_8$:Eu |
| Example 26 | 401 | $BaMgAl_{10}O_{17}$:Eu + Example 13 + $CaAlSiN_3$:Eu |
| Comparative example 4 | 393 | $BaMgAl_{10}O_{17}$:Eu + $BaMgAl_{10}O_{17}$:Eu,Mn + $CaAlSiN_3$:Eu |

The average color rendering index Ra and the chromaticity of the light-emitting device in the examples 15 to 26 and the comparative example 4 are collectively shown in the following Table 3. The chromaticity of the light-emitting device was obtained by the emission spectrum obtained from the white color LED light-emitting device.

TABLE 3

| | Average color rendering index Ra | Chromaticity of light-emitting device |
|---|---|---|
| Example 15 | 83.0 | x = 0.372, y = 0.372 |
| Example 16 | 85.2 | x = 0.372, y = 0.372 |
| Example 17 | 95.9 | x = 0.372, y = 0.371 |
| Example 18 | 83.3 | x = 0.372, y = 0.371 |
| Example 19 | 89.1 | x = 0.372, y = 0.372 |
| Example 20 | 83.5 | x = 0.372, y = 0.370 |
| Example 21 | 96.4 | x = 0.372, y = 0.372 |
| Example 22 | 96.1 | x = 0.372, y = 0.371 |
| Example 23 | 89.2 | x = 0.372, y = 0.372 |
| Example 24 | 87.4 | x = 0.372, y = 0.371 |
| Example 25 | 91.7 | x = 0.372, y = 0.372 |
| Example 26 | 91.9 | x = 0.372, y = 0.373 |
| Comparative example 4 | 29.8 | x = 0.372, y = 0.372 |

As shown in the Table 3, while the average color rendering index Ra of the white color LED device in the comparative example remains as low as 30, the average color rendering index Ra in all examples are 83 or more. Especially in the example 21, the average color rendering index reaches as high as 96.4. This is caused by an emission spectrum of a luminescent material activated together with terbium and europium, especially of a narrowband emission in the vicinity of 490 nm by terbium of the embodiment.

Furthermore, since the chromaticity approaches very close to the perfect radiator locus (black body locus), this reveals that it is a light-emitting device which provides a high quality white color light.

As shown in the Table 4 below, by using a luminescent material of the example 4, a blue color luminescent material, and a red color luminescent material, and combining them with LED chips having peak wavelength of 392 to 394 nm, light-emitting devices for examples 27 to 30 were fabricated. Furthermore, by using a luminescent material of the comparative example 1, a blue color luminescent material, and a red color luminescent material, and combining them with LED chips having peak wavelength of 392 to 395 nm, light-emitting devices for comparative examples 5 to 8 were fabricated. Concretely, a resin containing luminescent material was applied by potting to LED chips bonded on the frame, and a light-emitting device with a surface bonding structure was fabricated as shown in FIG. 16. In addition, mixing ratio of the luminescent materials is adjusted with a purpose that the color temperature of the light-emitting device will become 2,800K, 3,500K, 5,000K, and 6,500K.

As shown in the Table 5, the average color rendering index Ra of the white color LED device of the comparative example is 89 even at most. The average color rendering index Ra of the white color LED device in any of the examples are 92 or more. Furthermore, since the chromaticity approaches closer to the perfect radiator locus (black body locus), it reveals that this is a light-emitting device which provides a high quality white light.

Furthermore, as shown in the Table 6 below, by combining luminescent materials and LED chips, light-emitting devices of examples 31 to 33 were fabricated. As the light-emitting device, one with a constitution as shown in FIG. 17 was fabricated in a similar method above described.

TABLE 6

| | Peak wavelength of exciting light (nm) | Used fluorescent substance |
| --- | --- | --- |
| Example 31 | 400 | $BaMgAl_{10}O_{17}$:Eu + Example 4 + $3.5MgO \cdot 0.5MgF_{10} \cdot GeO_2$:Eu |
| Example 32 | 420 | $2SrO \cdot 0.84P_2O_5 \cdot 0.16\ B_2O_3$:Eu + Example 4 + $3.5MgO \cdot 0.5MgF_{10} \cdot GeO_2$:Eu |
| Example 33 | 440 | Example 6 + $3.5MgO \cdot 0.5MgF_{10} \cdot GeO_2$:Eu |

TABLE 4

| | Color temperature (K) | Peak wavelength of exciting light (nm) | Used fluorescent substance |
| --- | --- | --- | --- |
| Example 27 | 2800 | 394 | $BaMgAl_{10}O_{17}$:Eu + Example 4 + $CaAlSiN_3$:Eu |
| Example 28 | 3500 | 393 | $BaMgAl_{10}O_{17}$:Eu + Example 4 + $CaAlSiN_3$:Eu |
| Example 29 | 5000 | 392 | $BaMgAl_{10}O_{17}$:Eu + Example 4 + $CaAlSiN_3$:Eu |
| Example 30 | 6500 | 393 | $BaMgAl_{10}O_{17}$:Eu + Example 4 + $CaAlSiN_3$:Eu |
| Comparative example 5 | 2800 | 395 | $BaMgAl_{10}O_{17}$:Eu + Comparative example 1 + $CaAlSiN_3$:Eu |
| Comparative example 6 | 3500 | 392 | $BaMgAl_{10}O_{17}$:Eu + Comparative example 1 + $CaAlSiN_3$:Eu |
| Comparative example 7 | 5000 | 393 | $BaMgAl_{10}O_{17}$:Eu + Comparative example 1 + $CaAlSiN_3$:Eu |
| Comparative example 8 | 6500 | 392 | $BaMgAl_{10}O_{17}$:Eu + Comparative example 1 + $CaAlSiN_3$:Eu |

The average color rendering index Ra and the chromaticity of the light-emitting device of the examples 27 to 30, and of comparative examples 5 to 8 are collectively written in the following Table 5.

TABLE 5

| | Average color rendering index Ra | Chromaticity of light-emitting device |
| --- | --- | --- |
| Example 27 | 92.6 | x = 0.452, y = 0.409 |
| Example 28 | 96.3 | x = 0.406, y = 0.391 |
| Example 29 | 94.0 | x = 0.345, y = 0.352 |
| Example 30 | 92.3 | x = 0.314, y = 0.324 |
| Comparative example 5 | 89.2 | x = 0.452, y = 0.409 |
| Comparative example 6 | 86.2 | x = 0.406, y = 0.391 |
| Comparative example 7 | 82.7 | x = 0.345, y = 0.352 |
| Comparative example 8 | 82.2 | x = 0.314, y = 0.323 |

The average color rendering index Ra and the chromaticity of the light-emitting device of the examples 31 to 33 are collectively written in the following Table 7.

TABLE 7

| | Average color rendering index Ra | Chromaticity of light-emitting device |
| --- | --- | --- |
| Example 31 | 86.5 | x = 0.372, y = 0.372 |
| Example 32 | 91.7 | x = 0.372, y = 0.371 |
| Example 33 | 84.5 | x = 0.372, y = 0.372 |

As shown in the Table 7, since the average color rendering index Ra of either of the white color LED devices of examples are 84 or more, this reveals that they are light-emitting devices sufficiently practicable for use.

According to the embodiments of the present invention, the luminescent materials which are excited by the light having main light-emitting peaks at 370 to 460 nm and caused to emit light, their manufacturing methods, and light-emitting devices using such luminescent materials are provided.

Additional advantages and modifications will readily occur to those skilled in the art. Therefore, the present invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A luminescent material comprising:
a compound having composition represented by following general formula (A)

$$(Sr_{a1}, Ba_{b1}, Ca_{c1}, Tb_{v1}, Eu_{w1})_2SiO_4 \quad (A)$$

wherein, a1, b1, c1, v1, and w1 satisfy following relationships:

$$a1+b1+c1+v1+w1=1 \quad (1);$$

$$0 \leq a1/(1-v1-w1) \leq 1 \quad (2);$$

$$0 \leq b1/(1-v1-w1) \leq 1 \quad (3);$$

$$0 \leq c1/(1-v1-w1) \leq 1 \quad (4);$$

$$0 < v1 \leq 0.15 \quad (5);$$

$$0 < w1 \leq 0.05 \quad (6).$$

2. The luminescent material according to claim 1, wherein b1, c1, v1, and w1 in the general formula (A) satisfy following relationships:

$$0 \leq b1/(1-v1-w1) \leq 0.2 \quad (3a);$$

$$0 \leq c1/(1-v1-w1) \leq 0.9 \quad (4a);$$

$$0 < v1 \leq 0.1 \quad (5a);$$

$$0 < w1 \leq 0.01 \quad (6a).$$

3. A light-emitting device comprising:
a light-emitting element emitting light, the light having a main light emission peak in a wavelength ranging from 370 nm to and 460 nm; and
a luminescent layer comprising a luminescent material configured to be irradiated with the light, at least a part of the luminescent material being the luminescent material of claim 1.

4. The light-emitting device according to claim 3, wherein the luminescent layer comprising another luminescent material having a main light emission peak in a wavelength ranging from 580 nm to 680 nm.

5. The light-emitting device according to claim 3, wherein the luminescent layer comprising another luminescent material having a main light emission peak in a wavelength ranging from 430 nm to 510 nm.

6. A luminescent material comprising:
a compound having a composition represented by the following general formula (B)

$$(Sr_{a2}, Ba_{b2}, Ca_{c2}, Tb_{v2}, Eu_{w2})_2SiO_4 \quad (B)$$

wherein M is at least one selected from the group consisting of Li, Na, K, Rb, and Cs, and a2, b2, c2, v2, and w2 satisfy following relationships:

$$a2+b2+c2+2v2+w2=1 \quad (7);$$

$$0 \leq a2/(1-2v2-w2) \leq 1 \quad (8);$$

$$0 \leq b2/(1-2v2-w2) \leq 1 \quad (9);$$

$$0 \leq c2/(1-2v2-w2) \leq 1 \quad (10);$$

$$0 < v2 \leq 0.15 \quad (11);$$

$$0 < w2 \leq 0.05 \quad (12).$$

7. A light-emitting device comprising:
a light-emitting element emitting light, the light having a main light emission peak in a wavelength ranging from 370 nm to 460 nm; and
a luminescent layer comprising a luminescent material configured to be irradiated with the light, at least a part of the luminescent material being the luminescent material of claim 6.

8. The light-emitting device according to claim 7, wherein the luminescent layer comprising another luminescent material having a main light emission peak in a wavelength ranging from 580 nm to 680 nm.

9. The light-emitting device according to claim 7, wherein the luminescent layer comprising another luminescent material having a main light emission peak in a wavelength ranging from 430 nm to 510 nm.

* * * * *